United States Patent
Yamada et al.

(10) Patent No.: US 9,224,983 B2
(45) Date of Patent: Dec. 29, 2015

(54) SUBSTRATE FOR SURFACE LIGHT EMITTING DEVICE AND METHOD OF MANUFACTURING THE SUBSTRATE, SURFACE LIGHT EMITTING DEVICE, LIGHTING APPARATUS, AND BACKLIGHT INCLUDING THE SAME

(75) Inventors: Yukika Yamada, Yokohama (JP); Tadao Yagi, Yokohama (JP); Kenichi Nagayama, Yokohama (JP); Ryuichi Satoh, Yokohama (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 778 days.

(21) Appl. No.: 13/331,316

(22) Filed: Dec. 20, 2011

(65) Prior Publication Data
US 2012/0155093 A1    Jun. 21, 2012

(30) Foreign Application Priority Data

Dec. 20, 2010 (JP) ................. 2010-0283676
May 11, 2011 (KR) ............ 10-2011-0044079
Nov. 25, 2011 (JP) .................. 2011-257728

(51) Int. Cl.
*H01L 51/52* (2006.01)

(52) U.S. Cl.
CPC ........ *H01L 51/5275* (2013.01); *H01L 51/5268* (2013.01); *H01L 2251/5369* (2013.01)

(58) Field of Classification Search
CPC ................. H01L 51/5275; H01L 2251/5369; H01L 51/5268

USPC ........ 362/311.01; 427/165; 216/24; 313/503, 313/504, 512
See application file for complete search history.

(56) References Cited

U.S. PATENT DOCUMENTS

| 2004/0217702 A1* | 11/2004 | Garner et al. ................. 313/512 |
| 2009/0153972 A1* | 6/2009 | Nakamura et al. ............ 359/599 |
| 2010/0060142 A1* | 3/2010 | Itou et al. ...................... 313/498 |

FOREIGN PATENT DOCUMENTS

| JP | 10-241856 A | 9/1998 |
| JP | 2000164142 A | 6/2000 |

(Continued)

OTHER PUBLICATIONS

Greenham, et al., Angular Dependence of the Emission from a Conjugated Polymer Light-Emitting Diode: Implications for Efficiency Calculations, Advanced Materials, 1994, 6, No. 6, pp. 491-494.

(Continued)

*Primary Examiner* — John P Dulka
(74) *Attorney, Agent, or Firm* — Cantor Colburn LLP

(57) ABSTRACT

A substrate for a surface light emitting device in which a transparent electrode, an organic thin film layer, and a cathode electrode are sequentially stacked, the substrate including: a transparent support substrate; and a highly refractive layer that is disposed between the support substrate and the transparent electrode and comprises at least one layer having a refractive index that is equal to or greater than a refractive index of the support substrate, wherein the highly refractive layer comprises a light diffusion unit that diffuses light incident from the transparent electrode and a planarized surface that contacts the transparent electrode. Accordingly, a Haze value of the highly refractive layer is set to be 5% or less, and a diameter of bubbles existing in the highly refractive layer is set to be 1/10th or less of a thickness of the highly refractive layer.

19 Claims, 17 Drawing Sheets

(56) References Cited

FOREIGN PATENT DOCUMENTS

| | | |
|---|---|---|
| JP | 2003-297572 A | 10/2003 |
| JP | 2005063704 A | 3/2005 |
| JP | 2009-238507 A | 10/2009 |
| JP | 2009259805 A | 11/2009 |
| KR | 1020040010342 A | 1/2004 |
| KR | 1020100051631 A | 5/2010 |
| KR | 1020100101076 A | 9/2010 |
| WO | 2009/017035 A1 | 2/2009 |

OTHER PUBLICATIONS

C.W. Tang, et al.; Organic Electroluminescent Diodes; Applied Phys. Lett. vol. 51, No. 12, Sep. 21, 1987; pp. 913-915.

* cited by examiner

SUBSTRATE FOR SURFACE LIGHT EMITTING DEVICE AND METHOD OF MANUFACTURING THE SUBSTRATE, SURFACE LIGHT EMITTING DEVICE, LIGHTING APPARATUS, AND BACKLIGHT INCLUDING THE SAME

CROSS-REFERENCE TO RELATED APPLICATIONS

This application claims priority to Japanese Patent Application No. 2010-0283676, filed on Dec. 20, 2010, Korean Patent Application No. 10-2011-0044079, filed on May 11, 2011, Japanese Patent Application No. 2011-257728, filed on Nov. 25, 2011, and Korean Patent Application No. 10-2011-0257728, filed on Dec. 15, 2011, and all the benefits accruing therefrom under 35 U.S.C. §119, the contents of which in their entireties are herein incorporated by reference.

BACKGROUND

1. Field

The present disclosure relates to a substrate for a surface light emitting device, the surface light emitting device, a lighting apparatus, a backlight including the lighting apparatus, and a method of manufacturing the substrate.

2. Description of the Related Art

Recently, flat panel type backlights have been actively developed. A typical surface light emitting device used for the flat panel type display devices is an organic electro-luminescence device (OLED). The OLED is a light-emitting device that uses electroluminescence of a solid phosphorescent material. However, the OLED has a stack structure in which materials having different refractive indices are stacked, and thus light irradiation efficiency of OLED to the outside by reflection through an interface (light extraction efficiency) is low.

When calculating a light extraction efficiency by simple calculation, a ratio between light which is confined in each layer and which thus cannot be extracted to the outside and light that is irradiated to the outside is about 45% for waveguide light that is confined in a transparent electrode or an organic thin film layer and cannot be extracted, and about 35% for substrate waveguide light that is confined in the substrate and cannot be extracted. Thus, just about 20% of emitted light may be extracted to the outside. The same result is disclosed in Advanced Material 6 (p. 491, 1994) (hereinafter referred to as "non-patent reference 1").

Various studies have been performed to change the light emission angle by providing a means on a substrate of an OLED. Specifically, a diffraction grid structure may be provided on a substrate to increase light extraction efficiency by preventing reflection of light having a specific wavelength, or a lens structure may be provided on a surface of the substrate to obtain the similar effect. The structures above may provide an effect in increasing light extraction efficiency. However, these structures are substantially fine and complicated, and thus, the application of such fine and complicate structures in manufacturing process may not be practically and efficiently performed.

However, for example, in Japanese patent publication No. 2009-238507 (hereinafter "patent reference 1"), the light extraction efficiency is increased by reducing the thin-film guided-wave using a specific glass material having the same or similar refractive index as a transparent conductive layer. When a structure such as a lens is formed on a side of the substrate opposite to the organic thin layer through which light is emitted, the thin-film guided-wave still remains in the transparent electrode or the light emitting layer, and thus the thin-film guided-wave may not be extracted. However, in the method described in the patent reference 1, the thin-film guided-wave may be extracted. However, the substrate having a specifically high refractive index used in the patent reference 1 is substantially expensive for commercial mass production.

In another method of reducing the thin-film guided-wave, a structure that may convert a refractive angle using a diffraction grid or a diffusing structure is inserted between the substrate and the transparent conductive layer (e.g., an indium tin oxide (ITO)). In this case, since the manufacturing of a transparent electrode film along with the structure of the substrate may not be efficiently performed, a surface of a structure may be planarized using a material having the same refractive index as the transparent electrode.

For example, in Japanese Patent publication No. 1998-241856 (hereinafter "patent reference 2"), a method of manufacturing an inorganic light emitting device is proposed. In this method, a substrate having a non-uniform corrugate is used as a substrate of the inorganic light emitting device after smoothing a surface of the substrate using a spin on glass ("SOG") material. Also, in Japanese patent publication No. 2003-297572 (hereinafter "patent reference 3"), a method of increasing light extraction efficiency of an OLED by reducing the thin-film guided-wave is proposed. In this method, an SiN film having a high refractive index with a thickness in a range from about 0.4 micrometer (μm) to about 2 micrometers (μm) is formed on a substrate having a surface roughness Ra in a range from about 0.01 μm to about 0.6 μm using a chemical vapor deposition ("CVD"), and the substrate on which the SiN film is formed is used as a substrate for manufacturing the OLED.

Also, in another method of reducing the thin film guided-wave light, for example, in International Publication No. WO 2009/017035 (hereinafter "patent reference 4"), a method of forming a glass layer that includes a diffusing component such as air and has a high refractive index between ITO and a substrate is proposed.

In addition, Japanese Patent publication No. 2010-198797 (hereinafter "patent reference 5") discloses a method of manufacturing a glass substrate for an organic EL device in which a transparent conductive layer is formed on a surface of the glass substrate and an organic EL device is formed on the transparent conductive layer, wherein the EL device includes a glass substrate, on a surface of which a corrugated surface for diffusing light emitted from the EL device is formed, and a glass sintering layer that has a higher refractive index than that of the glass substrate and is arranged on the corrugated surface of the glass substrate, wherein the glass sintering layer planarizes corrugation of the corrugated surface of the glass substrate to provide a surface on which the transparent conductive layer is to be formed.

SUMMARY

When the method proposed in the patent reference 2 is used, a spin on glass (SOG) material is used as a planarizing material for planarizing the corrugate. However, when the SOG material is used, a film having a thickness greater than a thickness in a range from about 1 μm to about 2 μm may not be effectively formed without any defect. That is, in the method proposed in the patent reference 2, when the corrugate is formed so as to reduce the thin-film guided-wave, planarization may not be possible. With the form of the corrugation with which planarization is possible, the thin-film guided-wave may not be effectively reduced. The planarizing layer for planarizing the corrugate has a refractive index substantially equal to a refractive index of an electrode thereon. However, in the patent reference 2, the detailed effect of reducing the thin-film guided-wave is unclear because no description about the refractive index of the planarization material is presented.

In the method proposed in the patent reference 3, SiN having a high refractive index is used for planarizing a substrate. SiN is formed by using a CVD method. However, this method may not be effectively performed when the OLED has a large area or a mass production is considered.

In the method proposed in the patent reference 4, diffusing components such as pores or fillers are intentionally formed in a glass layer having a high refractive index so that the glass layer itself may perform as a diffusing layer. However, when pores or fillers are present in a portion of the glass layer that contacts a transparent electrode, a transparent conductive layer may be non-uniformly formed, and the lifetime and reliability of the OLED may be impaired due to the non-planarized surface of the glass layer (substrate) having a high refractive index. In the patent reference 4, a method of intentionally not forming pores on a surface of the glass layer having a high refractive index is described. However, when this method is used, manufacturing defects may occur.

Also, according to the method disclosed in the patent reference 5, planarization of a surface of the glass sintering layer is still low at a sintering temperature of a glass paste, and bubbles which are expected to exist inside the glass sintering layer when the glass sintering layer is formed are not described at all. Thus, it is difficult to form a uniform transparent conductive layer on the glass sintering layer described in the patent reference 5, and this it is difficult to provide a long lifespan or reliability of the OLED.

As described above, if a surface on which a transparent conductive layer (transparent electrode) is to be formed, that is, an interface between the transparent conductive layer and a substrate, is not planar, the manufacturing yield of OLED is reduced or the lifespan or reliability of the OLED is reduced.

As described above, a method of increasing light extraction efficiency that allows efficient mass production with simple process and a high yield, a long lifespan, and reliability of a surface light emitting device has not been currently proposed.

Accordingly, the present invention provides a substrate for a surface light emitting device, the surface light emitting device, an illumination apparatus or a backlight that uses the surface light emitting device, whereby the problems in terms of mass production or manufacturing simplicity are solved, and light extraction efficiency of a surface light emitting device is improved and a yield thereof is improved to increase lifespan and reliability of the surface light emitting device.

When a glass layer having a light diffusion function for improving an extraction efficiency of a support substrate of a glass substrate or the like is formed, and a glass paste composite including a low-melting point glass frit which has a refractive index equal to or higher than a refractive index of the support substrate is used as a material for planarizing an interface between a transparent electrode and the glass layer, light which is totally internally reflected by a boundary surface of respective layers and thus cannot be extracted in a device according to Snell's Law may be extracted outside the device (in the air). Also, in order to increase a yield of the device and to improve the lifespan and reliability of the device, bubbles or binders that are close to the transparent electrode and exist inside the glass layer formed by the glass paste composite need to be actively removed, and the removal may be performed by sintering the glass paste composite in a vacuum or under a pressure.

According to an aspect of the present invention, a substrate for a surface light emitting device in which a transparent electrode, an organic thin film layer, and a cathode electrode are sequentially stacked, includes: a transparent support substrate; and a highly refractive layer that is disposed between the support substrate and the transparent electrode and comprises at least one layer having a refractive index that is equal to or greater than a refractive index of the support substrate, wherein the highly refractive layer comprises a light diffusion unit that diffuses light incident from the transparent electrode and a planarized surface that contacts the transparent electrode.

A layer of the highly refractive layer that is adjacent to the transparent electrode may have a Haze value of 5% or less.

A diameter of bubbles in the highly refractive layer may be 1/10th of a thickness of a layer of the highly refractive layer that is adjacent to the transparent electrode, and a ratio of the bubbles in the layer adjacent to the transparent electrode may be a ratio of a surface area of a horizontal cross-section of the bubbles with respect to a total horizontal cross-sectional area of the layer adjacent to the transparent electrode and is 0.5% or less or a ratio of a surface area of a vertical cross-section of the bubbles with respect to a total vertical cross-sectional area of the layer adjacent to the transparent electrode and is 0.5% or less.

An interface between the support substrate and the highly refractive layer may be a corrugated surface.

A layer thickness of the highly refractive layer may be 30 times or greater and 40 times or less than an average surface roughness of the corrugated surface.

A layer thickness of the highly refractive layer may be 1.3 times or greater and 20 times or less than an average surface roughness of the corrugated surface.

The highly refractive layer may have a thickness in a range from about 3 μm to about 100 μm.

The corrugated surface may have an average surface roughness in a range from about 0.7 μm to about 5 μm.

The corrugated surface may have a non-uniform corrugated shape structure.

The corrugated surface may have a uniform corrugated shape structure.

The corrugated surface may have at least one of a pyramid-shaped ridge and a lens-shaped ridge.

The highly refractive layer may be a single layer.

The highly refractive layer may include: a light diffusion layer that is adjacent to the support substrate and includes the light diffusion unit; and a planarization layer that is adjacent to the transparent electrode and has the planarized surface.

The light diffusion layer may include a glass material and a diffusion material that has a refractive index different from a refractive index of the glass material.

An interface between the support substrate and the highly refractive layer may be a non-corrugated surface.

The highly refractive layer may include a glass paste composite comprising a glass frit, a solvent, and a resin.

The glass frit may have a glass transition temperature in a range from about 350° C. to about 450° C.

A refractive index of the highly refractive layer and a refractive index of the transparent electrode may satisfy the following inequality: nd1/nd2≥0.9, wherein nd1 denotes the refractive index of the highly refractive layer, and nd2 denotes the refractive index of the transparent electrode.

According to another aspect of the present invention, a method of manufacturing a substrate for a surface light emitting device, includes: coating a surface of a transparent support substrate with a glass paste composite containing a glass frit having a refractive index that is equal to or greater than a refractive index of the support substrate, a solvent, and a resin; drying the glass paste composite to dry the solvent by volatilizing the solvent; and sintering the glass paste composite after the solvent is volatilized, in a vacuum or under a pressure.

The glass paste composite may be sintered in a vacuum of 0.3 Pa or less.

The glass paste composite may be sintered under a pressure of 110 kPa or greater.

The glass frit may have a glass transition temperature in a range from about 350° C. to about 450° C.

The glass paste composite may be sintered at a temperature in a range from about 350° C. to about 500° C.

The method may further include forming a corrugated surface in the surface of the support substrate before the coating.

The corrugated surface may be formed by at least one of a sand blast method and a wet etching method.

The glass paste composite may further include a diffusion material having a refractive index different from a refractive index of the glass frit.

According to another aspect of the present invention, a surface light emitting device includes: the substrate for a surface light emitting device described above; and a transparent electrode stacked on the substrate; an organic thin film layer disposed on the transparent electrode; and a cathode electrode stacked on the organic thin film layer.

According to another aspect of the present invention, an illumination apparatus includes the surface light emitting device described above.

According to another aspect of the present invention, a backlight includes the surface light emitting device described above.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
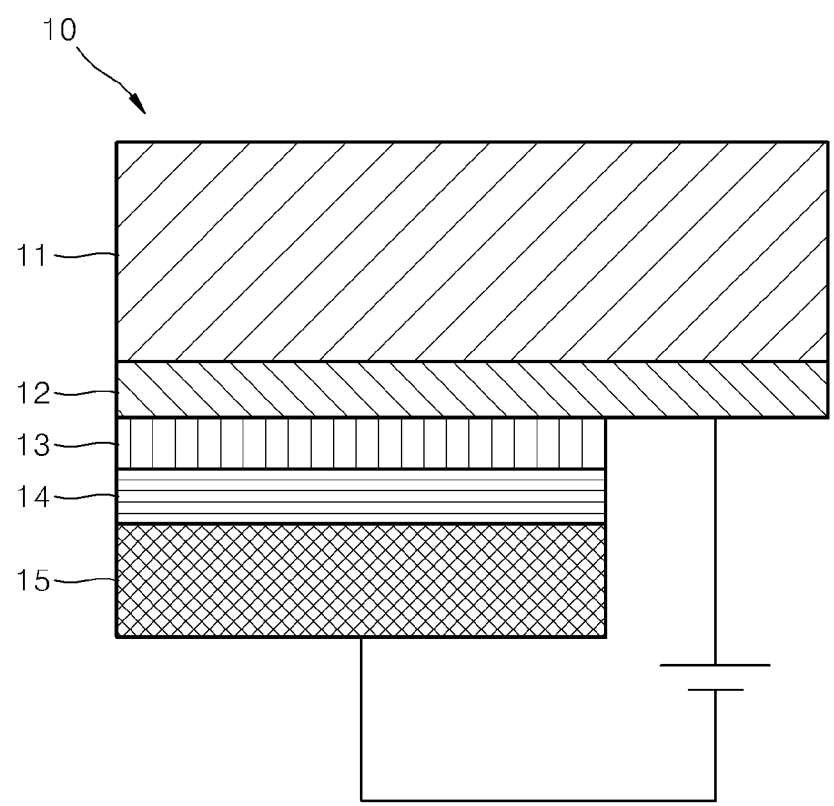
FIG. 1 is a cross-sectional view of a conventional organic light emitting device ("OLED")

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, embodiments of the invention will be described in further detail with reference to the accompanying drawings.

[Objective of OLED]

Before describing the preferred embodiments of the present invention, the objective of conventional OLEDs will be described to provide background information for the present invention.

(Configuration of Conventional OLED)

First, the configuration of a conventional OLED will be described with reference to FIG. 1. FIG. 1 is a cross-sectional view of a conventional OLED.

Referring to FIG. 1, the OLED 10 includes: an anode electrode 12, which may be formed via a sputtering method or a resistive heating evaporation method using a transparent conductive film, such as indium tin oxide ("ITO"), on the substrate 11 including glass; a hole transport layer ("HTL") 13, which may be formed via a resistive heating evaporation method on the anode electrode 12 using N,N'-Di(1-naphthyl)-N,N'-diphenyl-benzidine ("NPD"); a light emitting layer 14, which may be formed via a resistive heating evaporation method on the HTL 13 using tris(8-hydroxyquinoline) aluminum ("Alq3"); and the cathode electrode 15, which may be formed via a resistive heating evaporation method on the light emitting layer 14 using a metal film, such as an aluminum film. When a direct current ("DC") voltage or a direct current is applied to the OLED 10 having the above configuration in which the anode electrode 12 is a plus pole and the cathode electrode 15 is a minus pole, holes are injected to the light emitting layer 14 from the anode electrode 12 through the HTL 13 and electrons are injected to the light emitting layer 14 from the cathode electrode 15. The holes and electrons are re-combined in the light emitting layer 14, and excitons are thereby generated. In such an OLED having the above configuration, when the excitons are changed from an excited state to a ground state, light is emitted.

In the OLED 10 described above, light emitted from a phosphor of the light emitting layer 14 is generally emitted to air through the HTL 13, the anode electrode 12 and the substrate 11 after being emitted omnidirectionally from the phosphor. Alternatively, the light is emitted to air through the light emitting layer 14, the HTL 13, the anode electrode 12 and the substrate 11 after being reflected once by the cathode electrode 15 towards an opposite direction to the light extraction direction (the substrate 11 direction). However, when the light passes through a media interface, where a second medium into which light enters has a refractive index greater than a refractive index of a first medium which emits the light, the light having an incident angle greater than a critical angle may not pass through the media interface due to total internal reflection. Accordingly, the light may be totally reflected and not be emitted to air.

A relationship between a refractive angle of light and a refractive index of a medium at an interface of different materials generally follows Snell's law. According to the Snell's law, when light progresses from a medium 1 having a refractive index n1 to a medium 2 having a refractive index n2, the equation $n1 \sin \theta1 = n2 \sin \theta2$ holds between an incident angle $\theta1$ and a refractive angle $\theta2$. In this relationship, when $n1 > n2$ and $\theta2 = 90°$, an incident angle $\theta1 = \text{Arcsin}(n1/n2)$ is referred to as a critical angle, and when the incident angle is greater than the critical angle, light is totally reflected at an interface between the medium 1 and the medium 2. Accordingly, in an OLED in which light is isotropically emitted, light that is emitted at an angle greater than the critical angle is trapped within the device by repeated total reflection at the interface and is not emitted to air.

Figure 2:
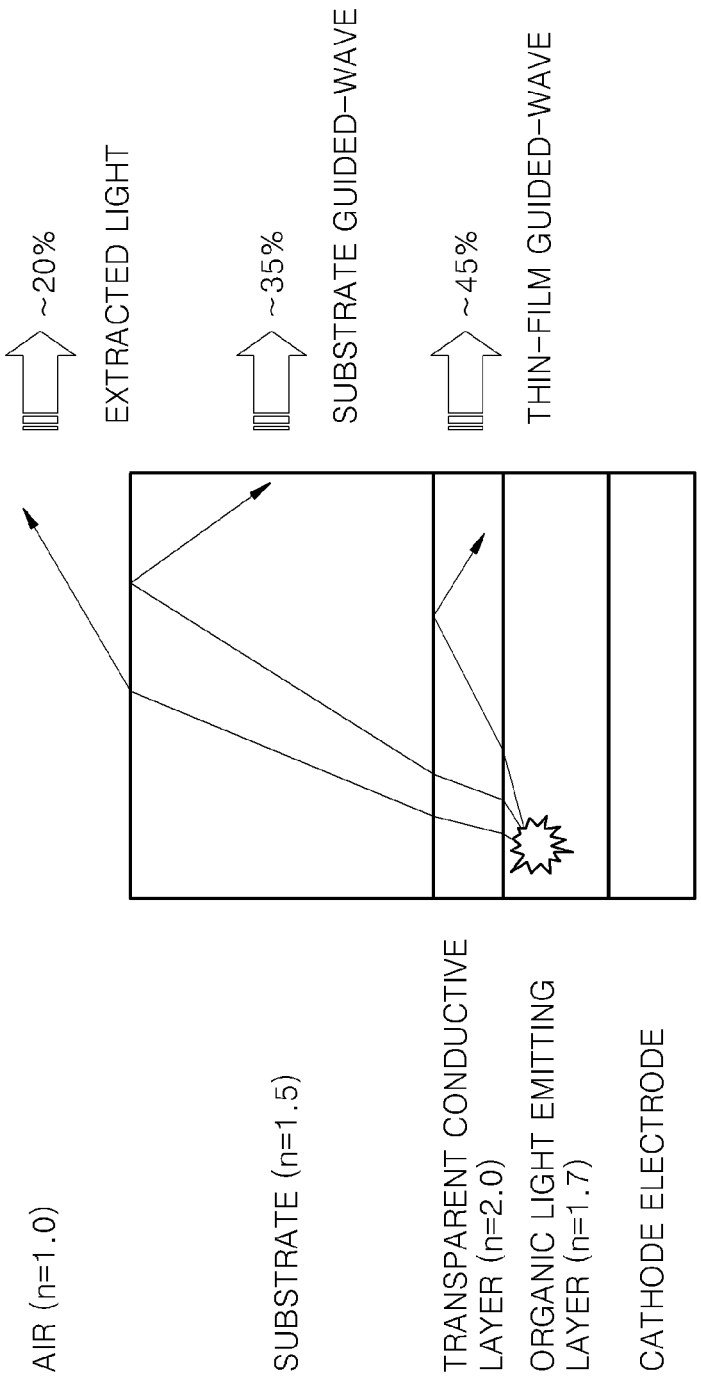
FIG. 2 is a schematic drawing for explaining a ratio of light that may not be emitted to an outside by being trapped in layers on a conventional OLED with respect to light that is emitted to the outside.

A ratio of light extraction of the conventional OLED 10 will now be described with reference to FIG. 2. FIG. 2 is a schematic drawing for explaining a ratio of light that may not be emitted to an outside by being trapped in each layer of the OLED 10 with respect to light that is emitted to the outside, and a simple calculation is performed by using the Snell's law. In FIG. 2, it is assumed that an HTL and a light emitting layer that constitute the OLED 10 have substantially the same refractive index $n=1.7$ (in FIG. 2, an organic thin film layer is integrally depicted), a transparent electrode including ITO has $n=2.0$, and a substrate including glass has $n=1.5$. As depicted in FIG. 2, the ratio of thin-film guided-wave that may not be extracted to the outside by being trapped in the transparent electrode or in the light emitting layer is about 45%, the ratio of substrate guided-wave that may not be extracted to the outside by being trapped in the substrate is about 35%, and the ratio of light that may be extracted to the outside from the generated light is about 20%.

Since the OLED has low light extraction efficiency as described above, a number of methods have been suggested to improve its light extraction efficiency. However, in the suggested methods, while the light extraction efficiency is improved to some extent, problems are generated in terms of mass production or manufacturing simplicity.

Also, when manufacturing surface light emitting devices such as an OLED, a surface that is adjacent to a transparent electrode of a substrate needs to have a high degree of planarization. Surface light emitting devices are often formed of thin layers (several tens nm to several μm), and thus if a surface of a substrate is corrugated, a current leakage is generated and hinders stable driving of a surface light emitting device. Accordingly, if a surface of the substrate adjacent to the transparent electrode (an interface between a transparent conductive layer and the substrate) or the transparent electrode itself is not planar, a manufacturing yield of the OLED is reduced or the lifespan or reliability of the OLED is reduced. However, in the above-described examples in which improvement of light extraction efficiency is sought, planarization of the surface of the substrate adjacent to the transparent electrode is not sufficiently considered.

Currently, techniques of manufacturing OLEDs, whereby mass production or manufacturing simplicity may be obtained and the light extraction efficiency, yield, lifespan, or reliability of the OLED may be improved, are not available.

[Outline of the Present Invention]

The present invention is implemented based on two principles.

The first principle is improving light extraction efficiency while enabling mass production or manufacturing simplicity. According to this principle, a glass layer having a light diffusion function for improving extraction efficiency is formed on a surface of a support substrate such as a glass substrate, and a glass paste composite including a low-melting point glass frit having a refractive index equal to or greater than that of the support substrate is used as a material for planarizing an interface between a transparent electrode of the glass layer and the glass layer. Accordingly, according to Snell's Law, light which is totally internally reflected in respective interface between layers and thus cannot be extracted through a device may be extracted to the outside of the device (in the air).

The second principle is improvement of a yield of a device while improving the lifespan and the reliability of the device at the same time. According to the second principle, bubbles or binders that are close to the transparent electrode and exist inside the glass layer formed by the glass paste composite are to be actively removed. To effectively remove the bubbles or binders, the glass paste composite may be sintered in a vacuum or under a pressure. Accordingly, large bubbles in the interface between the transparent electrode and the glass layer may be prevented, thereby significantly increasing planarization of the surface of the substrate that is adjacent to the transparent electrode.

Hereinafter, four preferred embodiments of the present invention which are based on the two principle described above will be described. However, an OLED according to the embodiments of the present invention is not limited to the four embodiments, and may also have other structures as long as means satisfying the two principles are contained therein.

First Embodiment

Configuration of Surface Light Emitting Device 100

First, the configuration of a surface light emitting device 100 according to an embodiment of the present invention will be described with reference to FIG. 3.

Figure 3:
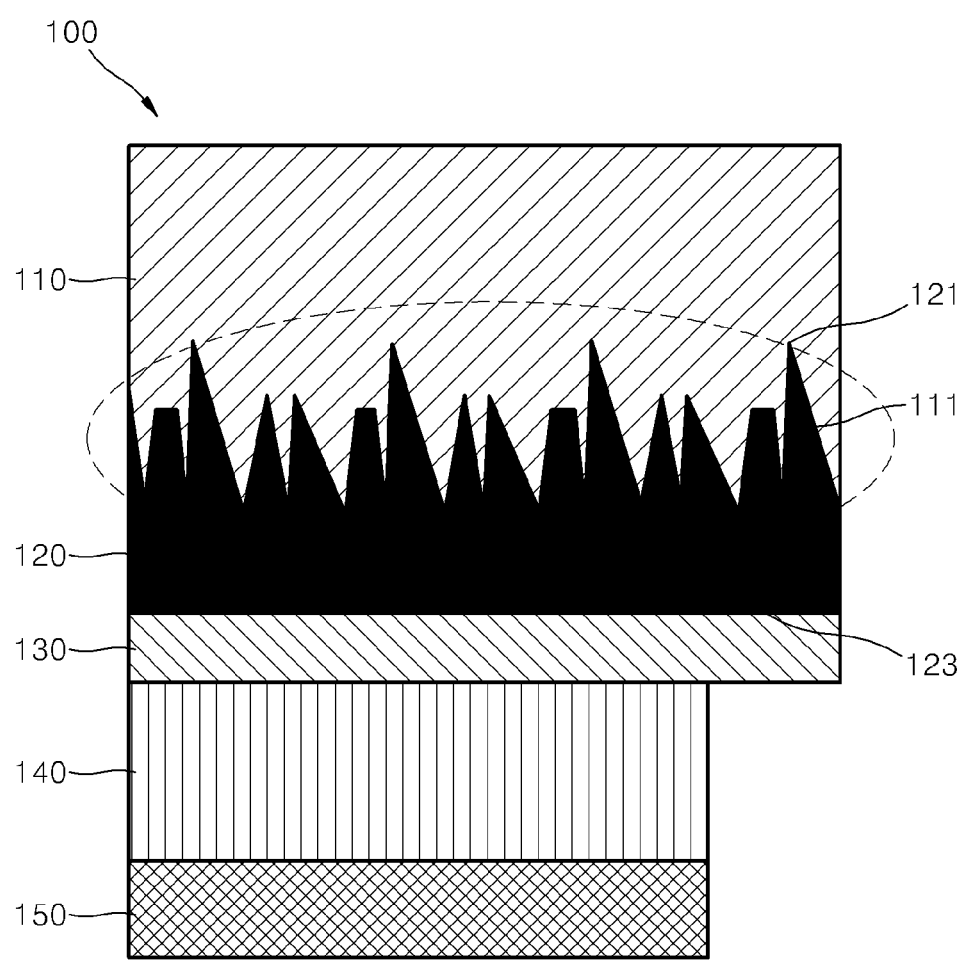
FIG. 3 is a cross-sectional view of an embodiment of a surface light emitting device according to an embodiment of the present invention.

FIG. 3 is a cross-sectional view of a surface light emitting device 100 according to an embodiment of the present invention.

Referring to FIG. 3, the surface light emitting device 100 may include a support substrate 110, a highly refractive layer 120, a transparent electrode (transparent conductive layer) 130, an organic thin film layer 140, and a cathode electrode 150. A substrate for the surface light emitting device 100 may include the support substrate 110 and the highly refractive layer 120.

A corrugated surface 111 is formed on a surface of the support substrate 110, and the surface light emitting device 100 has a structure in which a surface of the corrugated surface 111 (surface that contacts the transparent electrode 130) is planarized by the highly refractive layer 120. In addition, in the surface light emitting device 100, the highly refractive layer 120 is formed of a single layer that includes a light diffusion unit 121 that diffuses light incident from the transparent electrode 130 and a planarized surface 123 contacting the transparent electrode 130. Hereinafter, each of components of the surface light emitting device 100 will be described in detail.

(Support Substrate 110)

The support substrate 110 may be a substrate including a transparent material such as glass (e.g., soda lime glass), non-alkali glass and a transparent plastic. The support substrate 110 may have a corrugated surface 111. The transparent plastic in the support substrate 110 may be, for example, an insulating organic material selected from the group consisting of polyether sulfone ("PES"), polyacrylate ("PA"), poly (methylmethacrylate) ("PMMA"), polyether imide ("PEI"), polyethylene naphthalate ("PEN"), polyethylene terephthalate ("PET"), polyphenylene sulfide ("PPS"), polyarylate ("PAR"), polyimide, polycarbonate ("PC"), cellulose tri acetate ("TAC"), and cellulose acetate propionate ("CAP"). The corrugated surface 111 may have non-uniform ridges that change a refractive angle of incident light, such that incident light is diffused, when light generated from the organic thin layer 140 enters the support substrate 110 through the transparent conductive layer 130. In an embodiment, the highly refractive layer 120 is provided on the corrugated surface 111 using a planarizing material which will be described later. In an embodiment, the planarizing material may be a paste material including glass frit, and a fusion of glass frit may be performed by sintering. In such an embodiment, since the sintering is performed at a temperature of about 500 degree Celsius (° C.), the support substrate 110 may include a glass material having a high melting point instead of a plastic material having a low melting point. In an embodiment, the sintering process may be performed at a temperature in range between about 350° C. and about 500° C.

The degree of corrugation of the corrugated surface 111 is not specifically limited. In an embodiment, the average surface roughness Ra of the corrugated surface 111 may be in a range between about 0.7 micrometer (μm) and about 5 micrometers (μm) as specified in Japanese Industrial Standard ("JIS") B 0601-2001. When the average surface roughness Ra is less than about 0.7 μm, the light extraction effect may not be substantially high. When the average surface roughness Ra is greater than about 5 μm, the light extraction efficiency may be substantially reduced. Accordingly, in an embodiment, light is repeatedly reflected in the surface light emitting device 100 whenever the light passes through the light diffusion unit 121 (a region close to an interface between the support substrate 110, on which the corrugated surface 111 is formed, and the highly refractive layer 120) and may be eventually extracted to the outside of the surface light emitting device 100 such that the light extraction efficiency is increased by diffusing the light. When considering the above-described mechanism, if the average surface roughness Ra is large, the highly refractive layer 120 necessarily becomes thicker for the purpose of planarizing. When a thickness of the highly refractive layer 120 having a high refractive index is substantially large, the loss of light by absorption in the highly refractive layer 120 having a high refractive index may be substantially increased. In an embodiment, the glass frit used as a material of the highly refractive layer 120 includes a metal oxide and has a small attenuation coefficient k of light in the visible wavelength such that the attenuation of the light and diffusion may be substantially decreased due to small numbers of reflections or diffusions.

Generally, the use of a substrate having a high surface roughness make a large quantity of light scatted in a display device to may not be desirable since light spreads out of each pixel by light scattering. However, in order to increase the light extraction efficiency, some degree of corrugations (surface roughness) is needed. If the substrate has a high degree of corrugations, in order to use such a substrate as a display, research has to be conducted. Thus, respective specifications may be satisfied by optimizing uses of corrugations (Ra) formed in a surface of a substrate as a display, illumination, or a backlight, thereby allowing extraction of light through a front side. Therefore, the support substrate 110 according to the current embodiment includes the corrugate surface 111 having a relatively large average surface roughness Ra.

Also, the average surface roughness Ra and a maximum surface roughness Rz, which will be described later, may be readily measured by using a contact type surface roughness tester or a non-contact type optical surface roughness tester.

When the corrugated surface 111 is provided on the support substrate 110, light that enters the corrugated surface 111 is diffused such that the amount of light that passes through the support substrate 110 without changing direction is reduced. This state may be referred to as haze of a substrate. Haze of a substrate may denote a ratio (e.g., in percentage) of the components of transmitted light that are not vertical to a substrate with respect to the components of all of the transmitted light after incident light that enters vertically to the substrate (e.g., the support substrate 110) passes through the substrate. In an embodiment, the haze of the support substrate 110 may be equal to or greater than about 30%. In an alternative embodiment, the haze of the support substrate 110 may be equal to or greater than about 50%. In another alternative embodiment, the haze of the support substrate 110 may be equal to or greater than about 70%. Haze of a substrate may be measured using a transmission meter, on which a light integrating sphere system is attached, or a commercially available haze meter.

(Highly Refractive Layer 120)

The highly refractive layer 120 is interposed between the support substrate 110 and the transparent electrode 130 described above and has a refractive index that is equal to or greater than a refractive index of the support substrate 110. The highly refractive layer 120 includes the light diffusion unit 121 that diffuses light incident from the transparent electrode 130 and the planarized surface 123 that contacts the transparent electrode 130.

Here, as described above, to manufacture a surface light emitting device such as an OLED, a high degree of planarization is required of a surface for a light emitting device. Accordingly, the highly refractive layer 120 having the planarized surface 123 is provided on the corrugated surface 111 of the support substrate 110 and to be adjacent to the transparent electrode 130 by using a glass paste composite including a glass frit so as to planarize the corrugated surface 111 formed on the support substrate 110. As materials for planarizing the corrugation of the substrate surface, various materials such as spin on glass (SOG) materials or a chemical vapor deposition (CVD) layer are suggested as described above. However, with these materials, it is difficult to form a layer thickness that is sufficient to planarize a corrugation having a large roughness, or expensive, high-level equipment and a long time are required to form layers. If a SOG material is used, a maximum thickness of layers that may be formed is 1 to 2 μm at most, and a layer thickness of a SiN layer that is formed by using a CVD method in practical is also only several μm. A structure (corrugation) for adjusting a refraction angle of incident light to a substrate or the like, such as diffusion or collection of light, is to have a greater structure than a wavelength of the incident light (a corrugated surface having a greater roughness than the wavelength of the incident light); if a SOG material or a CVD method is used, the corrugated surface may not be planarized.

However, according to the current embodiment of the present invention, the highly refractive layer 120 includes a glass frit, and the planarization of the corrugated surface 111 may be performed by coating a glass paste formed by mixing a glass frit in a solvent having a high boiling point, such as terpineol or butyl carbitol acetate, and a viscosity modifying binder resin, such as ethylcellulose or acryl resin, on the support substrate 110 and drying and sintering the glass paste. In such an embodiment, the highly refractive layer 120 having a predetermined film thickness may be formed. In an embodiment, the glass paste composite for forming the highly refractive layer 120 may include a glass frit, a solvent and a resin. Hereinafter, the components of an embodiment of the glass paste composite will be described in greater detail.

<Glass Frit>

The glass frit used in an embodiment may have a thermal characteristic to form a transparent glass layer (the highly refractive layer 120) at a temperature at which distortion or deformation of the support substrate 110 may not occur. When a high temperature higher than 500° C. is applied to a glass substrate (for example, soda lime glass) that is used as the support substrate 110, distortion or deformation may occur, and thus, a bending occurs in the support substrate 110. In order, the glass transition temperature Tg of the glass frit may be about 450° C. or below 450° C. to form the highly refractive layer 120 at a temperature below about 500° C. In an alternative embodiment, the glass transition temperature Tg of the glass frit may be about 400° C. or below 400° C.

Also, when the glass frit has a coefficient of linear expansion different from a coefficient of linear expansion of the material of the support substrate 110, stress remains in the support substrate 110 when the highly refractive layer 120 is provided thereon such that a crack may appear in the support substrate 110. Therefore, an embodiment of the glass frit may have a coefficient of linear expansion substantially equal to or similar to a coefficient of linear expansion of the material (for example, soda lime glass or non-alkali glass) of the support substrate 110. In one embodiment, for example, where the glass frit includes soda lime glass, the soda lime glass has a coefficient of linear expansion of about $85 \times 10^{-7}/°C.$, and the glass frit may have a coefficient of linear expansion of about $(85\pm10)\times10^{-7}/°$ C. In an embodiment, the difference between the coefficient of linear expansion of the glass frit and the coefficient of linear expansion of the support substrate 110 is less than or equal to about $\pm10\times10^{-7}/°$ C. such that a risk of occurrence of a defect, such as a crack, in the thin highly refractive layer 120 formed by the glass frit is substantially decreased.

A material used to form the highly refractive layer 120, e.g., the glass frit, may have a refractive index substantially equal to or greater than a refractive index of the support substrate. Also, a refractive index of the glass frit may be equal to that of the transparent electrode 130 which is formed of, for example, ITO. A typical surface light emitting device such as an organic light emitting device has a refractive index of about 1.5, and a transparent electrode (transparent conductive layer) has a refractive index of about 2. If the highly refractive layer 120 has a refractive index substantially equal to or similar to a refractive index of the support substrate 110, the reflection at an interface between the highly refractive layer 120 and the transparent conductive layer 130 may be substantially the same as a case where the corrugated surface 111 and the highly refractive layer 120 are not provided, and thus, the light extraction efficiency may not be increased. In detail, a refractive index of the highly refractive layer 120 of a substrate for a surface light emitting device according to the current embodiment of the present invention may be from about 1.7 to about 2.5. Alternatively, a refractive index nd1 of a glass frit for forming the highly refractive layer 120 (e.g., measured at the yellow doublet sodium D-line, with a wavelength of 589 nanometers), and a refractive index nd2 of the transparent conductive layer 130 (which may include, for example, ITO) needs to satisfy the following inequality: nd1/nd2≥0.9. The reason for this will be described below.

Figure 4:
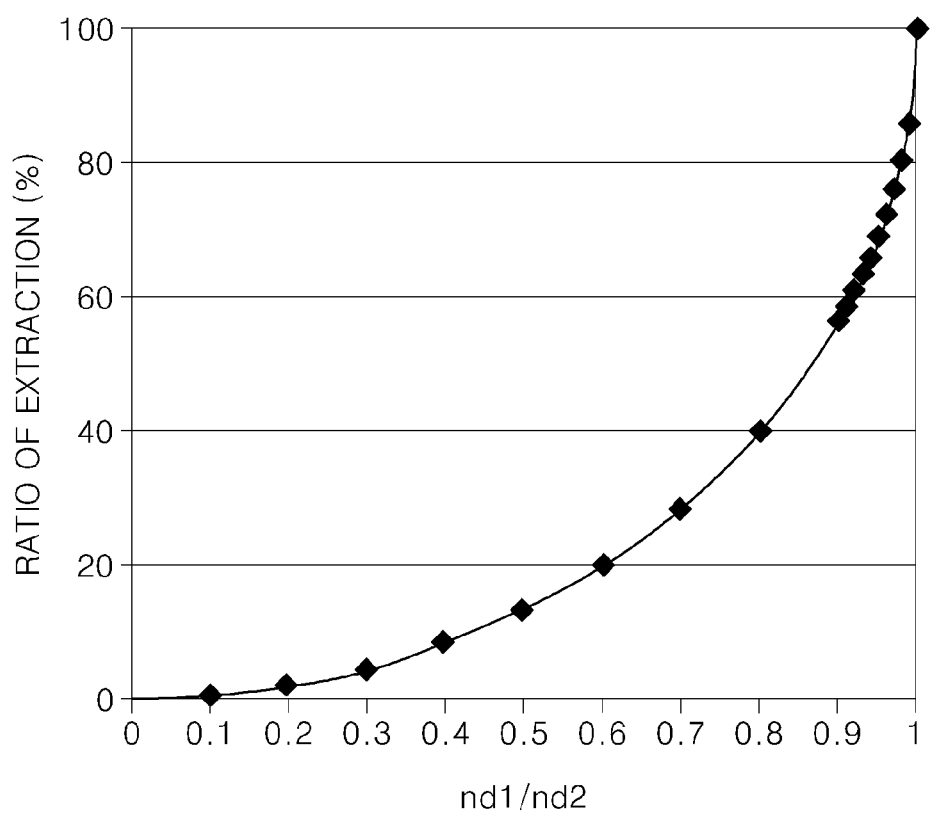
FIG. 4 is a graph showing a degree of extraction of light at a single interface in a steradian conversion by assuming that all of light more than a critical angle may be extracted.

As described above, a critical angle θ at an interface of medias having different refractive indexes n1 and n2, respectively may be determined according to Snell's law. The critical angle θ satisfy the following equation: θ=Arcsin(n2/n1). For example, a critical angle at an interface of, for example, a typical glass (for example, nd=1.5) and ITO (for example, nd=2) is about 48.6° according to the equation described above, and incident light at an angle equal to or less than about 48.6° is dissipated after passing through the ITO or the organic thin film layer such that the incident light may not be extracted. FIG. 4 is a graph showing a degree of extraction of light at a single interface in a steradian conversion by assuming that light at an angle greater than the critical angle is extracted. The extraction rate (in percentage) shown on the vertical axis (longitudinal axis) of FIG. 4 has a value (1– cos θ) obtained by dividing a steradian sr=2π(1– cos θ) by a steradian 2π of a half sphere (which corresponds to a total steradian when the entire light is extracted).

When nd1/nd2≥0.9, the total reflection at an interface is substantially reduced as shown in FIG. 4, and thus, the total reflection at the interface between the transparent electrode 130 and the support substrate 110 is reduced. Also, the relationship between nd1 and nd2 may satisfy the following inequality: nd1/nd2≥1, to effectively prevent the effect of total reflection. In one embodiment, for example, the transparent conductive layer 130 including ITO has a refractive index nd2=2.0, and the highly refractive layer 120 has a refractive index nd1 equal to or greater than about 1.8 or about 2.

In an embodiment, the glass frit having a low glass transition temperature and a high refractive index may include at least one selected from the group consisting of $P_2O_5$, $SiO_2$, $B_2O_3$, $Ge_2O$ and $TeO_2$, as a network former, and may include at least one selected from the group consisting of $TiO_2$, $Nb_2O_5$, $WO_3$, $Bi_2O_3$, $La_2O_3$, $Gd_2O_3$, $Y_2O_3$, $ZrO_2$, ZnO, BaO, PbO and $Sb_2O_3$, as a component for high refractive index. In an alternative embodiment, the glass frit may include at least one of an alkali metal oxide, an alkali earth metal oxide, and a fluoride, as a component for controlling the characteristic of the glass to have a high refractive index. A component system of the glass frit may include at least one of, for example, a $B_2O_3$—ZnO—$La_2O_3$ system, a $P_2O_5$—$B_2O_3$—$R'_2O$—R"O—$TiO_2$—$Nb_2O_5$—$WO_3$—$Bi_2O_3$ system, a TeO2-ZnO system, a $B_2O_3$—$Bi_2O_3$ system, a $SiO_2$—$Bi_2O_3$ system, a $SiO_2$—ZnO system, a $B_2O_3$—ZnO system and a $P_2O_5$—ZnO system. Here, R' refers to an alkali metal element, and R" refers to an alkali earth metal element. However, the invention is not limited the component systems described above. In an embodiment, the glass frit may include any component system that satisfies the conditions of glass transition temperature or the refractive index. A material of the glass frit may be any material having a high refractive index and a low melting point about 450° C. or below while not being limited a specific material. In an embodiment, the material may be a non-lead glass due to environmental problems. In an embodiment, a component for a high refractive index may be at least one selected from the group consisting of $TiO_2$, $Nb_2O_5$, $WO_3$, $Bi_2O_3$, $La_2O_3$, $Gd_2O_3$, $Y_2O_3$, $ZrO_2$, ZnO, BaO, PbO and $Sb_2O_3$. In one embodiment, for example, a component of the highly refractive layer 120 having a low melting point on the support substrate 110 having a relatively low thermal resistance (e.g., a soda lime glass) may be glass that includes $Bi_2O_3$. A glass composition that includes $Bi_2O_3$ may be a system selected from the group consisting of, for example, a $Bi_2O_3$—$B_2O_3$—$SiO_2$—ZnO system, a $Bi_2O_3$—$B_2O_3$—$SiO_2$ system, a $Bi_2O_3$—$B_2O_3$—$ZnO_2$ system and a $Bi_2O_3$—$B_2O_3$—$R_2O$—$Al_2O_3$ system, where R is an alkali metal.

<Solvent>

In an embodiment, a solvent used in the glass paste composite including the glass frit may include organic solvent, but not being limited thereto. When the organic solvent is rapidly dried in a manufacturing process, a solid material may be extracted. In an embodiment, the solvent may not be substantially rapidly dried. In an embodiment, the organic solvent to be used in the glass paste composite may be a solvent having a boiling point of higher than about 150° C. In an alternative embodiment, the organic solvent may have a boiling point higher than about 180° C. In an embodiment, the solvent may be, for example, a terpene group solvent (e.g., terpineol), or a carbitol group solvent (e.g., butylcarbitol and butylcarbitol acetate).

<Resin>

In an embodiment, a resin in the glass paste composite may be any resin having a predetermined viscosity for applying the glass paste composite, but not being limited to a specific resin. In an embodiment, a resin that may be removed at a temperature lower than the glass transition temperature of the glass frit may be used. When the resin is not removed by sintering at a temperature lower than the temperature at which the glass frit becomes fluid, the resin may be gasified at the temperature at which the glass is sintered, and thus, air bubbles may be formed in the glass. The resin may be at least one selected from the group consisting of, for example, ethylcellulose or nitrocellulose as a cellulose group resin and an acryl resin or a metacryl resin as an acryl group resin.

<Other Additives>

In an embodiment, the glass paste composite may further include an additive which increases dispersibility of the glass frit and resin and effectively controls rheology. In an embodiment, the additive may be, for example, a polymer that is added to control viscosity for a process of slit coating or to increase dispersibility of the glass frit, a viscosity agent that is added to control rheology, and a dispersing agent added to form a glass paste composite having a high dispersibility. In an embodiment, the polymer may be, for example, an acryl group polymer. In an embodiment, the viscosity agent may be, for example, a cellulose group resin such as ethylcellulose or a polyoxyalkylene group resin such as polyethylene glycol. In an embodiment, the dispersing agent may be, for example, a polycarboxylic acid or its ammonium salt. In an embodiment, the polycarboxylic acid may be, for example, a polycarboxylic acid of a low to high aliphatic group, and may form an ammonium salt such as tetrabutyl-ammonium salt. In an alternative embodiment, the polycarboxylic acid may be HIPLAAD® series made by Kusumoto Chemical, Ltd. or Disperbyk® series made by BYK Co. In an embodiment, the content of the additives may be, for example, between about zero (0) to about 3 parts by mass with respect to the total mass of the glass paste composite.

<Layer Thickness>

In an embodiment, the thickness of the highly refractive layer 120 may be a predetermined thickness enough to planarize the corrugated surface 111 of the support substrate 110, but not being limited to a specific thickness. In an embodiment, the thickness of the highly refractive layer 120 may be greater than about 30 times the average surface roughness Ra of the support substrate 110 and less than about 40 times the average surface roughness Ra of the support substrate 110. In an embodiment, the thickness of the highly refractive layer 120 may be in a range from about 3 μm to about 100 μm. In such an embodiment, a maximum surface roughness Rz of the corrugated surface 111 formed by sand blast or etching may be in a range from about 10 times to about 20 times greater than the average surface roughness Ra.

In an embodiment, the highly refractive layer 120 may have a thickness about 1.3 times or greater than the maximum surface roughness Rz (described in JIS B 0601-2001) of the corrugated surface 111 of the support substrate 110. When the highly refractive layer 120 has a thickness about 1.3 times or less than the maximum surface roughness Rz, the highly refractive layer 120 may not have a substantial reliability with respect to driving stability.

As has been described above, the highly refractive layer 120 having the thickness described above may not be effectively provided using a SOG material (e.g., a sol-gel material) or a vacuum process (e.g., a chemical vapor deposition ("CVD") method). The highly refractive layer 120 having a thick film may be formed by using an organic material such as a polymer, but the highly refractive layer 120 including an organic material may not have a thermal resistance substantially high enough (e.g., about 300° C. or higher) such that the transparent electrode 130 (transparent conductive layer) including ITO may not be formed thereon, and the highly refractive layer 120 including an organic material may not have a high refractive index (e.g., equal to or higher than about 2.0), since no organic material that has this high refractive index. That is, without the use of the glass paste composite that contains the glass frit according to the current embodiment, the transparent planarizing layer 120 having a thickness described above may not be readily formed.

The thickness of the highly refractive layer 120 may be measured after sintering the highly refractive layer 120. However, since the thickness of the support substrate 110 may vary according to a measuring point since the support substrate 110 includes the corrugated surface 111. In an embodiment, the thickness of the highly refractive layer 120 is defined as a distance from the deepest part of the corrugated surface 111 to the uppermost part of the highly refractive layer 120. When the corrugated surface 111 has a non-uniform corrugated shape, thicknesses are measured at more than about 10 arbitrary selected positions on the highly refractive layer 120, and the maximum thickness of the thicknesses measured at the arbitrary selected positions may be defined as the thickness of the highly refractive layer 120.

<Method of Confirming the Structure, Etc.>

In an embodiment, when the corrugated surface 111 is planarized, the glass frit may fill all of deep valley portions of the corrugated surface 111 without any vacancies. Structures of the support substrate 110 and the highly refractive layer 120 may be effectively identified by observing cross-sectional views thereof using a scanning electron microscope ("SEM").

<Planarization of Interface Between the Highly Refractive Layer 120 and the Transparent Electrode 130>

When manufacturing the highly refractive layer 120 having the above-described configuration, occurrence of bubbles in the highly refractive layer 120 after sintering may be significantly prevented by sintering the glass paste composite described above in a vacuum or under a pressure. In detail, the number of bubbles existing in the highly refractive layer 120 due to the sintering in a vacuum or under a pressure may be reduced, and the size of the bubbles may also be reduced. By preventing generation of bubbles in the highly refractive layer 120, planarization of a surface of the highly refractive layer 120 adjacent to the transparent electrode 130, that is, planarization of an interface between the highly refractive layer 120 and the transparent electrode 130 may be remarkably improved. In addition, as the planarization of the interface between the highly refractive layer 120 and the transparent electrode 130 is improved, a manufacture yield of the surface light emitting device 100 may be improved, and also, since a current leakage is prevented, the lifespan and reliability of the surface light emitting device 100 are also improved. Moreover, planarization that is required for the interface between the highly refractive layer 120 and the transparent electrode 130 is equal to the surface roughness Ra of a surface of the highly refractive layer 120 adjacent to the transparent electrode 130, that is, 30 nm or less, and preferably, 1 nm or less.

Here, as one of indices of a degree of preventing bubbles inside the highly refractive layer 120, the above-described Haze value is used. That is, a Haze value of the highly refractive layer 120 adjacent to the transparent electrode 130 in the substrate for the light emitting device 100 according to the current embodiment is 5% or less. If the haze value of the highly refractive layer 120 exceeds 5%, the number of bubbles inside the highly refractive layer 120 increases, and sizes of the bubbles also increase. Consequently, sufficient planarization of the interface between the highly refractive layer 120 and the transparent electrode 130 may not be provided.

In addition, although a haze value of the highly refractive layer 120 may be measured by using a transmission meter on which a light integrating sphere system is attached or a haze meter, which may be obtained from the market, as a haze value of the highly refractive layer 120, not the whole value of the substrate for the surface light emitting device 100 but a single haze value of the highly refractive layer 120 is used.

Also, according to the current embodiment, a more direct index, to which a diameter of bubbles or a ratio of the bubbles among the highly refractive layer 120 is applied, may also be used as the index of degree of preventing bubbles inside the highly refractive layer 120. In this case, a diameter of the bubbles existing inside the highly refractive layer 120 is 1/10th or less of a thickness of the highly refractive layer 120 adjacent to the transparent electrode 130, preferably, 1/100th or less. In addition, an absolute value of the bubble diameter may preferably be 5 μm or less, and more preferably, 0.5 μm or less.

Here, the diameter of bubbles existing in the highly refractive layer 120 refers to a diameter of a circle while assuming the bubbles are circular or an average of diameters of all bubbles that are included in sight when observing the highly refractive layer 120 by using an optical microscope. The thickness of the highly refractive layer 120 is as described above.

In addition, a ratio of the bubbles among the highly refractive layer 120 adjacent to the transparent electrode 130 may refer to a ratio of a surface area of a horizontal cross-section of bubbles with respect to the entire horizontal cross-sectional area of the highly refractive layer 120 and may be 0.5% or less, or may refer to a ratio of a surface area of a vertical cross-section of bubbles with respect to the entire vertical cross-sectional area of the highly refractive layer 120 and may be 0.5% or less. Preferably, the ratio of the bubbles in the highly refractive layer 120 may be a ratio of a surface area of a horizontal cross-section of bubbles with respect to the entire horizontal cross-sectional area of the highly refractive layer 120 and may be 0.1% or less, or may be a ratio of a surface area of a vertical cross-section of bubbles with respect to the entire vertical cross-sectional area of the highly refractive layer 120 and may be 0.1% or less.

Here, the surface area of a horizontal (vertical) cross-section of bubbles refers to a surface area of a horizontal (vertical) cross-section of the bubbles while assuming the bubbles are spheres.

If the diameter of the bubbles existing in the highly refractive layer 120 and the ratio thereof in the highly refractive layer 120 exceed the above ranges, a probability that bubbles in the highly refractive layer 120 may protrude from the surface of the highly refractive layer 120 toward the transparent electrode 130 increases, and this makes it difficult to provide sufficient planarization of the interface between the highly refractive layer 120 and the transparent electrode 130.

On the other hand, if the diameter of the bubbles existing in the highly refractive layer 120 and the ratio thereof among the highly refractive layer 120 are both within the above ranges, the planarization of the interface between the highly refractive layer 120 and the transparent electrode 130 may be further improved.

<Corrugation of the Corrugated Surface 111>

The corrugation of the corrugated surface 111 may be non-uniform as described above, or may be uniform, a unit structure of which may be a lens structure or a pyramid structure. In addition, FIG. 5 is a cross-sectional view illustrating a surface light emitting device 100' according to another embodiment of the present invention.

Figure 5:
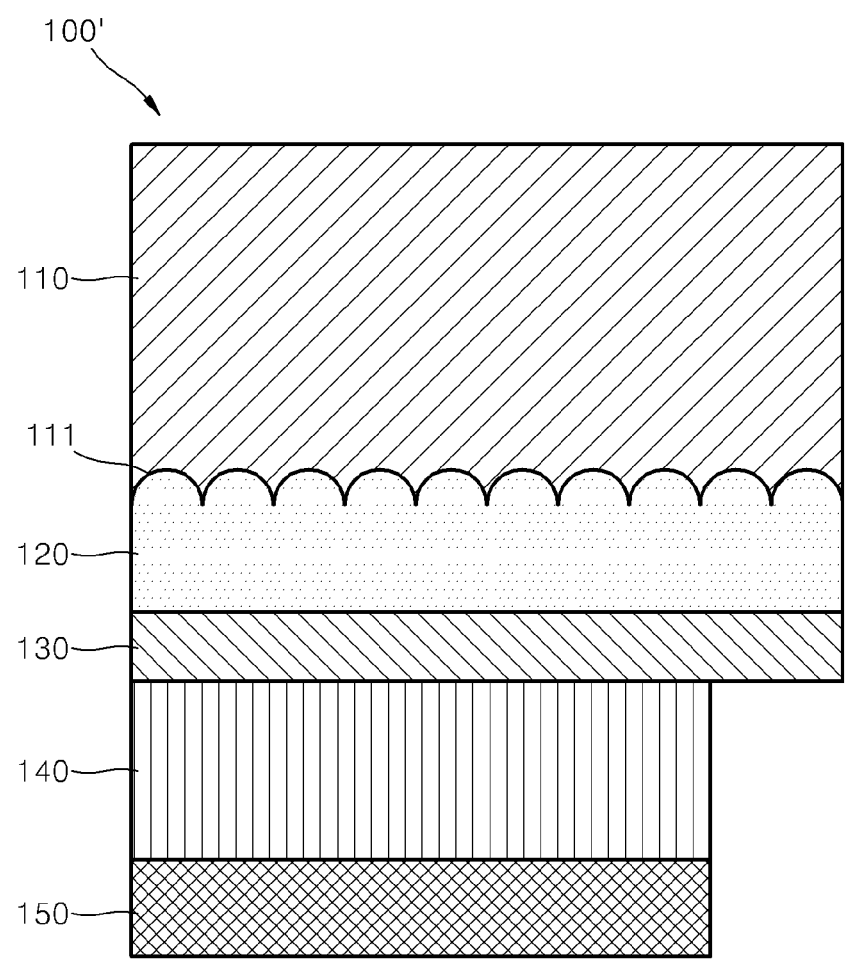
FIG. 5 is a cross-sectional view of the surface light emitting device of FIG. 3 according to another embodiment of the present invention.

As illustrated in FIG. 5, unlike the surface light emitting device 100 of FIG. 3 having a non-uniform structure, a corrugated surface 111 of a support substrate 110 has a uniform structure, a unit structure of which may be a lens structure or a pyramid structure, for example. When the surface light emitting device 100' is applied to a display, the corrugated surface 111 may have a uniform structure including a lens structure or a pyramid structure as shown in FIG. 5, instead of a non-uniform structure which scatters refraction angles. In the surface light emitting device 100 in FIG. 3, the corrugate surface 111 has a non-uniform structure such that a color spread may occur due to mixing of lights generated from each of the light emitting layers. In the surface light emitting device 100' of FIG. 5, light generated from an organic thin film layer 140 may be focused or collected by the corrugated surface 111 having a repeating unit structure such that the surface light emitting device 100' may effectively increase light extraction efficiency without the color spread that may occur in the surface light emitting device 100. In such an embodiment, the shape or size of the lens structure or the pyramid structure is not limited to a specific shape or size. In an embodiment, the lens structure or the pyramid structure may have a predetermined size based on the range of wavelengths of light generated from the organic thin film layer 140 to effectively realize a light focusing or collecting effect, and may have a unit structure smaller than a size of a pixel. The pixel size of a display is in a range from about 100 μm to about 600 μm, and each of the color sub-pixels has a size in a range from about 30 μm to about 200 μm, which is about ⅓ of the pixel size. Accordingly, the practical shape of the corrugated surface 211 may be a lens structure (substantially a half sphere shape) or a pyramid structure (substantially a quadrangular pyramid shape) having a size from a few μm to a few tens of μm (size of corrugate).

An embodiment of the surface light emitting device 100', where the corrugated surface 111 has a lens shape, is shown in FIG. 5, but not being limited thereto. In an alternative embodiment, the corrugated surface 111 may have a pyramid structure.

In an embodiment, the thickness of the highly refractive layer 120 is not limited to a specific thickness. In an embodiment, the highly refractive layer 120 may have a thickness to planarize the corrugated surface 111 of the support substrate 110. In an embodiment, the thickness of the highly refractive layer 120 may be equal to or greater than about 1.3 times the maximum size of the corrugated surface 111 of the support substrate 110. In an embodiment, where the corrugated surface 111 has a lens structure and the unit structure of the lens structure is a half sphere shape having a diameter of, for example, about 10 μm, the maximum size of the corrugated surface 111 of the support substrate 110 is about 5 μm, and thus, the thickness of the highly refractive layer 120 is equal to or greater than about 6.5 μm. In an embodiment, where the unit structure of the lens structure has a half sphere shape having a diameter of about 80 μm, the thickness of the highly refractive layer 120 may be equal to or greater than about 52 μm.

The surface light emitting device 100' is substantially the same as the surface light emitting device 100 shown in FIG. 3 except for the corrugated surface thereof, and thus, any repetitive detailed description thereof will be omitted.

The transparent electrode (transparent conductive layer) 130 having electrical conductivity may function as an anode electrode of the surface light emitting device 100, and may include a transparent material to extract light to the outside of the surface light emitting device 100. In an embodiment, the transparent electrode 130 may include a transparent oxide semiconductor having particularly a high work function such as ITO, indium zinc oxide ("IZO"), ZnO and $In_2O_3$, for example.

(Organic Thin Film Layer 140)

In an embodiment, the organic thin film layer 140 may include a hole transport layer and a light emitting layer. Alternatively, the organic thin film layer 140 may further include a hole injection layer. When the organic thin film layer 140 includes both the hole transport layer and the hole injection layer, the hole injection layer may be disposed closer to the transparent conductive layer 130 than the hole transport layer. Also, the light emitting layer may be disposed farther from the transparent conductive layer 130 than the hole transport layer.

In an embodiment, hole transport materials included in the hole transport layer may be a material selected from the group consisting of, for example, N,N'-di(naphthalene-1-yl)-N,N'-diphenyl benzidine ("α-NPD"), N,N'-diphenyl-N,N'-bis(1-naphthyl)-(1,1'-biphenyl)-(1,1'-biphenyl)-4,4'-d-iamine ("NPB"), N,N'-diphenyl-N,N'-bis(3-methylphenyl)-(1,1'-biphenyl)-4,4'-diamine ("TPD"), tetra-acetal-porphyrin ("TAcP"), triphenyl-tetramer and a combination thereof. Also, the hole injection materials may be a material selected from the group consisting of, for example, polyaniline ("PANI"), polypyrrole, copper phthalocyanine ("CuPc"), poly(3,4-ethylenedioxythiophene)poly(styrenesulfonate) ("PEDOT:PSS") and a combination thereof.

In an embodiment, the organic thin film layer 140 may include at least one or at least two of a red light emitting layer, a green light emitting layer and a blue light emitting layer.

In an embodiment, the red light emitting layer may include a material selected from the group consisting of, for example, 2-methyl-9,10-5,6,11,12-tetraphenylnaphthacene ("Rubrene"), tris(1-phenylisoquinoline)iridium (III) ("Ir(piq)3"), bis(2-benzo[b]thiopene-2-yl-pyridine)(acetylacetonate)iridium (III) ("Ir(btp)2(acac)"), tris(dibenzoylmethane) phenanthroline europium (III) ("Eu(dbm)3(phen)"), tri[4,4'-di-tert-butyl-(2,2')-bipyridine]ruthenium (III) complex ("Ru(dtb-bpy)3*2(PF6)"), 4-(dicyanomethylene)-2-methyl-6-(p-dimethylaminostyryl)-4H-pyran ("DCM1"), 4-(dicyanomethylene)-2-methyl-6-(julolindin-4-yl-vinyl)-4H-pyran ("DCM2"), Eu(trifluorthenoyl-acetone) 3 ("Eu(TTA)3"), 4-(dicyanomethylene)-2-t-butyl-6-(1,1,7,7-tetramethyljulolidyl-9-enyl)-4H-pyran ("DCJTB"), and a combination thereof. In an alternative embodiment, the red light emitting layer may include a polymer fight emitting material such as a polyfluorene group polymer or a polyvinyl group polymer.

The green light emitting layer may include a material selected from the group consisting of, for example, tris(8-hydroxyquinoline) aluminum ("Alq3"), 3-(2-benzothiazolyl)-7-(diethylamino) coumarin ("Coumarin 6"), 2,3,6,7-tetrahydro-1,1,7,7,-tetramethyl-1H,5H,11H-10-(2-benzothiazolyl)quinolidine-[9,9a,1gh]coumarin ("C545T"), N,N'-dimethyl-quinacridone ("DMQA"), and tris(2-quinacridone)iridium(III), ("Ir(ppy)3"), and a combination thereof. In an alternative embodiment, the green light emitting layer may include a polymer light emitting material such as a polyfluorene group polymer or a polyvinyl group polymer.

In an embodiment, the blue light emitting layer may include a material selected from the group consisting of, for example, an oxadiazole dimer dye ("Bis-DAPDXP"), a spiro compound (Spiro-DPVBi, Spiro-6P), a triarylamine compound, a bis(styryl)amine (DPVBi, DSA), 4,4'-bis(9-ethyl-3-carbazovynylene)-1,1'-biphenyl ("BCzVBi"), perylene, 2,5,8,11-tetra-tert-butylene ("TPBe"), 9H-carbazole-3,3'-(1,4-phenylene-di-2,1-ethen-diyl)bis[9-ethyl-(9C)] ("BCzVB"), 4,4-bis[4-(di-p-trylamino)styryl]biphenyl ("DPAVBi"), 4-(di-p-trilamino)-4'-[(di-p-trilamino)styryl]stilbene ("DPAVB"), 4,4'-bis[4-(diphenylamino)styryl]biphenyl ("BDAVBi"), bis(3,5-difluoro-2-(2-pyridyl)phenyl-(2-carboxypyridyl)iridium (III) ("FIrPic"), and a combination thereof. In an alternative embodiment, the blue light emitting layer may include a polymer light emitting material such as a polyfluorene group polymer or a polyvinyl group polymer.

In an embodiment, the organic thin film layer 140 may further include an electron injection layer and an electron transport layer. In an embodiment, the electron injection layer and the electron transport layer may be disposed sequentially from a position close to the cathode electrode 150 toward the light emitting layer. The electron transport layer may include a material selected from the group consisting of, for example, an oxazole derivative (PBD, OXO-7), a triazole derivative, a boron derivative, a silole derivative, Alq3, and a combination thereof. The electron injection layer may include a material selected from the group consisting of, for example, LiF, Li$_2$O, CaO, CsO, CsF$_2$ and a combination thereof.

(Cathode Electrode 150)

The cathode electrode 150 may include a metal having a small work function such as a material selected from the group consisting of Ag, Mg, Al, Pt, Pd, Au, Ni, Nd, Ir, Cr, Li, Ca and a combination thereof.

[Method of Manufacturing the Surface Light Emitting Device 100]

Figure 6:
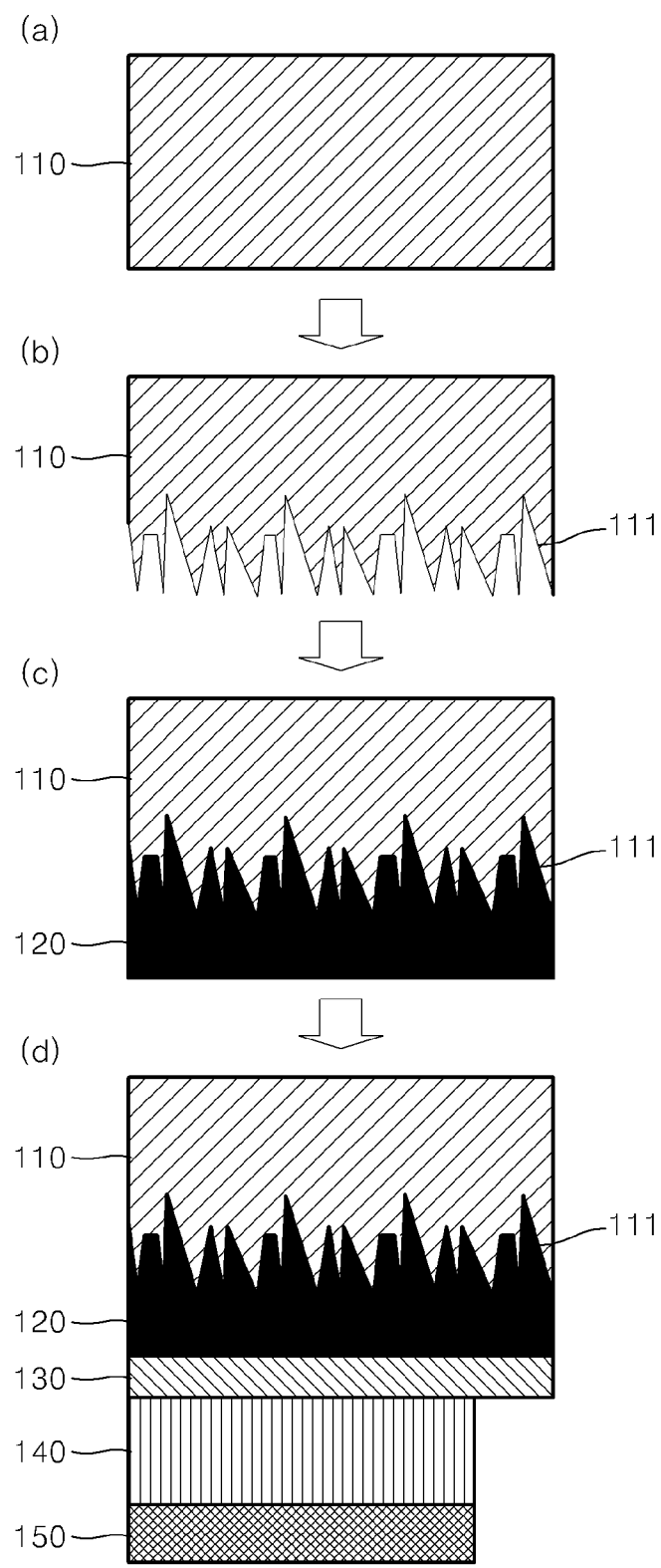
FIG. 6 illustrates a method of manufacturing the surface light emitting device of FIG. 3 according to an embodiment of the present invention.
Figure 7:
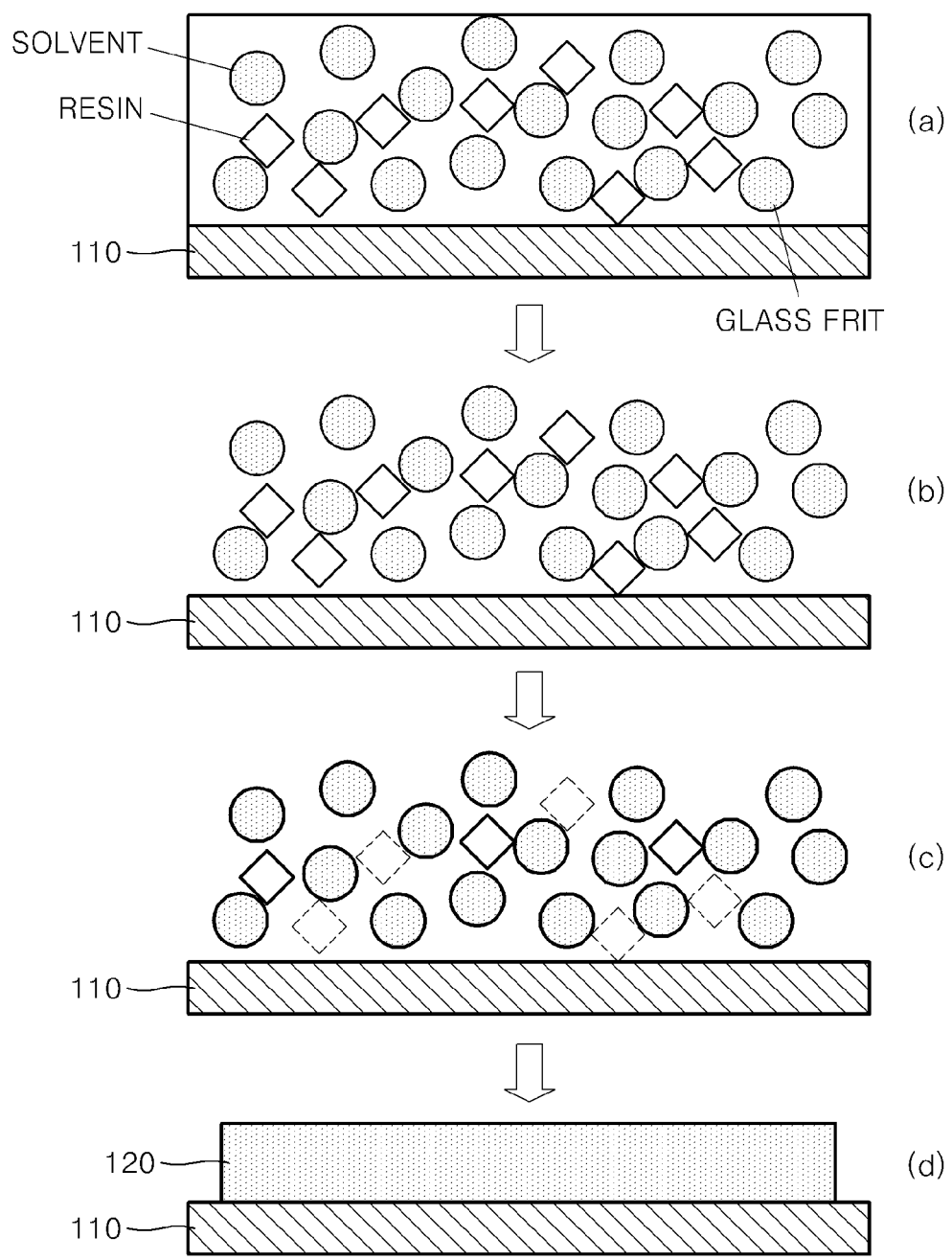
FIG. 7 illustrates a method of forming a highly refractive layer according to an embodiment of the present invention.

Hereinafter, a method of manufacturing the surface light emitting device 100 will now be described with reference to FIGS. 6 and 7. FIG. 6 is a block diagram showing an embodiment of a method of manufacturing the surface light emitting device 100 according to the invention. FIG. 7 is a block diagram showing an embodiment of a method of providing the transparent planarization layer 120 according to the invention.

The method of manufacturing the surface light emitting device 100 may include a surface roughening process, a coating operation, a drying operation, and a sintering operation. In the surface roughening operation, the corrugated surface 111 is formed on a surface of the support substrate 110. In the coating operation, a glass paste composite including a glass frit that has a refractive index that is equal to or greater than that of the support substrate 110; a solvent; and a resin is coated on the surface of the support substrate 110 on which the corrugated surface 111 is formed. In the drying operation, the glass paste composite coated on the support substrate 110 is dried to volatilize the solvent. In the sintering operation, the glass paste composite after the solvent thereof is volatilized is sintered in a vacuum or under a pressure to remove away the resin and fuse the glass frit at the same time, thereby forming the highly refractive layer 120 on the support substrate 110. Hereinafter, the method of manufacturing the surface light emitting device 100 including these operations will now be described.

(Surface Roughening Process)

As illustrated in FIG. 6, the non-uniform corrugated surface 111 (refer to (b) FIG. 5) which scatters refraction angle of incident light that is generated from the organic thin film layer 140 and enters the support substrate 110 through the transparent conductive layer 130 is formed on a surface (refer to (a) of FIG. 6) of the support substrate 110 including soda lime glass or non-alkali glass (refer to (b) FIG. 6). The corrugated surface 111 may be formed by sand blasting or etching (a frost method) the surface of the support substrate 110. In an embodiment, the corrugated surface 111 may have an average surface roughness Ra in a range from about 0.7 μm to about 5 μm, but not being limited thereto.

When forming the corrugated surface 111 having a uniform unit structure as illustrated in FIG. 5, the corrugated surface 111 of the support substrate 110 may be formed to have ridges having a uniform structure such as a lens structure or a pyramid structure, for example. The lens structure or the pyramid structure may be formed using, for example, a mold heat transfer method, a photolithography/wet etching method, a laser processing method, or a polishing using a whetstone.

(Preparation of the Glass Paste Composite)

Next, a glass paste composite that includes a glass frit, a solvent and a resin, which are described above, is prepared. The glass paste composite may be prepared by dissolving and mixing the glass frit, the resin (binder), and other components in the solvent, and then milling the mixture using a roll mill (roll mixing milling), such that a glass paste composite in which the glass frit is dispersed is obtained. In an embodiment, the mixing ratio of the glass frit, the solvent and the resin may be about 70 mass % to about 80 mass %, about 10 mass % to about 20 mass %, and about 1 mass % to about 2 mass %, respectively. In addition, as described above, the drying operation and the sintering operation, which will be described later, may be performed in consideration of a melting point of the support substrate 110 at a temperature of 500° C. or less, and to this end, a glass transition temperature of the glass frit may be 450° C. or less.

(Coating Operation)

Next, as illustrated in FIG. 7, in an embodiment, the prepared glass paste composite may be coated on a surface of the corrugated surface 111 of the support substrate 110 (refer to (a) of FIG. 7). The coating operation of the glass paste composite is not limited, and various well-known coating methods such as a bar coating method, a doctor-blade method, a slit coating method, or a die coating method may be used.

(Drying Operation)

Next, the solvent in the glass paste composite coated on the corrugated surface 111 may be removed by moving the support substrate 110 in a hot air dryer (refer to (b) of FIG. 7). Here, a drying temperature may be about 500° C. or less so that the support substrate 110 is not melted, as described above. Preferably, the drying temperature may be about 100° C. to about 150° C.

(Sintering Operation)

After the drying operation is performed, the support substrate 110 may be transferred to a furnace to sinter the same at a temperature in a range between the glass transition temperature Tg and the softening temperature Ts of the glass frit such that the binder resin is removed and simultaneously the glass frit is fused in a furnace by sintering the support substrate 110, from which the solvent is removed (refer to (c) of FIG. 7). Also, the highly refractive layer 120 is formed on the surface of the support substrate 110 by sintering the support substrate 110 at a temperature equal to or higher than the softening temperature Ts (e.g., equal to or higher than about 500° C.) of the glass frit in the furnace (refer to (d) of FIG. 7 and (c) of FIG. 6).

(The Principle of Vacuum Sintering and Pressure Sintering)

According to the current embodiment of the present invention, the sintering operation is performed in a vacuum or under a pressure. Thus, as described above, formation of bubbles in the highly refractive layer 120 after the sintering may be significantly prevented. By preventing bubbles in the highly refractive layer 120, planarization of the interface between the highly refractive layer 120 and the transparent electrode 130 is remarkably increased, thereby increasing a manufacture yield of the surface light emitting device 100 and increasing the lifespan and reliability of the surface light emitting device 100.

Here, the principle of preventing formation of bubbles by a vacuum sintering operation or a pressure sintering operation will be described below. This principle relates to the reason why bubbles exist inside the highly refractive layer 120. That is, air is mixed among the glass paste composite in the atmosphere and thus the air exists around the glass frit. Then, the air remains even after the sintering, thereby forming bubbles in the highly refractive layer 120. It is difficult to remove the bubbles in the glass paste composite formed inside the highly refractive layer 120 after the highly refractive layer 120 is formed. Accordingly, this problem is solved by preventing air from existing around a glass frit when the glass frit is being melted in a sintering operation, and to this end, the sintering operation is performed in a vacuum or under a pressure. So that no air exists around the glass frit when it is melted, it is important to form a vacuum or a pressure state before the glass frit is melted.

<Vacuum Sintering>

In a vacuum sintering operation, since a glass frit is in a vacuum state while it is being sintered, there is hardly any air existing around the glass frit as a matter of course. Thus, even when sintering a glass paste composite in such a state, bubbles hardly occur in the highly refractive layer 120 after the sintering. In order to effectively prevent formation of bubbles, a glass paste composite may be sintered in a vacuum of 0.3 Pa or less in the sintering operation.

<Pressure Sintering>

In a pressure sintering operation, a glass paste composite is compressed so that the glass frit is condensed. Thus, air hardly exists around the glass frit. Accordingly, even when the glass paste composite is sintered in such a state, bubbles hardly occur in the highly refractive layer 120 after the sintering operation. In order to effectively prevent formation of bubbles, a glass paste composite may be sintered under a pressure of 110 kPa or greater in the sintering operation.

As described above, the highly refractive layer 120 is formed by coating a paste composite containing the above-described glass frit and by drying and sintering the same; if necessary, these operations may be repeated to obtain a desired thickness. In particular, if a needed thickness of the highly refractive layer 120 exceeds about 40 μm to about 50 μm, the coating and sintering operations may be performed several times. To improve light extraction efficiency as described above, the maximum size of the corrugation of the support substrate 110 needs to be increased, and thus the thickness of the highly refractive layer 120 also needs to be increased for planarization of such large corrugation. Thus, when forming such large corrugation, a glass paste composite is coated and sintered several times so that the ridges or corrugation on the surface of the support surface 110 are further planarized.

(Formation of the Transparent Electrode 130, the Organic Thin Film Layer 140, and the Cathode Electrode 150)

Next, the transparent electrode (transparent conductive layer) 130 is provided on the support substrate 110, the surface of which is planarized by the highly refractive layer 120 by spin coating, sputtering, etc. using a material selected from the group consisting of ITO, IZO, ZnO, $In_2O_3$ and a combination thereof. In an embodiment, the surface light emitting device 100 having the organic thin film layer 140 including a hole transport layer and a light emitting layer may be provided by depositing a hole transport material or a light emitting material after forming the organic thin film layer 140 on the transparent conductive layer 130, and the cathode electrode 150 is provided on the organic thin film layer 140 by depositing a metal, e.g., Ag, Mg and Al (refer to (d) of FIG. 6). In addition, the organic thin film layer 140 and the cathode electrode 150 may be provided using a method, for example, a vacuum evaporation method, a casting method (a spin casting method or a dipping method), an inkjet method, and a printing method (typing printing, intaglio printing, offset printing or screen printing).

[Use of the Surface Light Emitting Device 100]

The substrate for a light emitting device according to the current embodiment of the present invention has corrugations (surface roughness) equal to or greater than a wavelength and thus may be used to effectively extract light of each wavelength by diffusing light that is incident on the surface light emitting device 100. Accordingly, the surface light emitting device 100 may be used as, for example, a white light surface light emitting device to be applied to an illumination apparatus with high light efficiency or a backlight for display devices.

Second Embodiment

[Configuration of Surface Light Emitting Device 200]

Figure 8:
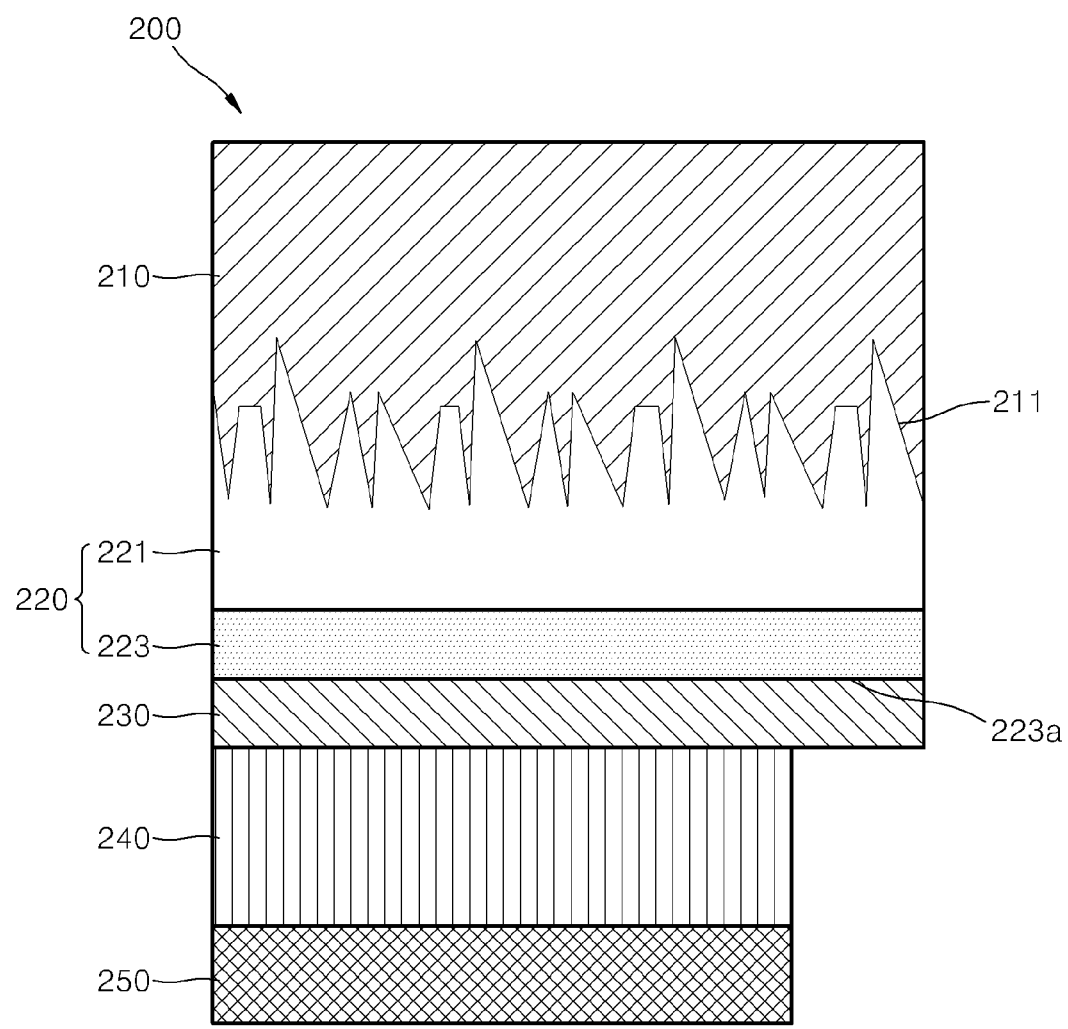
FIG. 8 is a cross-sectional view of a surface light emitting device according to another embodiment of the present invention.

Hereinafter, another embodiment of a surface light emitting device 200 according to the invention will now be described with reference to FIG. 8. FIG. 8 is a cross-sectional view of the surface light emitting device 200 according to another embodiment of the present invention.

Referring to FIG. 8, the surface light emitting device 200 may include a support substrate 210, a highly refractive layer 220, a transparent electrode (transparent conductive layer) 230, an organic thin film layer 240, and a cathode electrode 250. A substrate for a light emitting device may include the support substrate 210, the highly refractive layer 220 and the transparent electrode 230.

A corrugated surface 211 is formed on a surface of the support substrate 210, and the surface light emitting device 200 has a structure in which a surface of the corrugated surface 211 (surface that contacts the transparent electrode 230) is planarized by the highly refractive layer 220. In addition, the highly refractive layer 220 of the surface light emitting device 200 includes two layers, that is, a light diffusion layer 221 that is adjacent to the support substrate 210 and includes a light diffusion unit that diffuses light incident from the transparent electrode 230 and a planarization layer 223 that has a planarized surface 223a that is adjacent to the transparent electrode 230. As such, functions of the highly refractive layer 220 according to the current embodiment of the present invention are divided into the two layers; that is, a function of diffusing light incident from the transparent electrode 230 is allocated to the light diffusion layer 221, and a function of allowing an interface between the highly refractive layer 220 and the transparent electrode 230 to have a high degree of planarization to increase a yield of the surface light emitting device is allocated to the planarization layer 223. By dividing the functions of the highly refractive layer 220 into the two layers, each function may be performed with a higher level.

The description of the support substrate 110, the transparent electrode 130, the organic thin film layer 140, the cathode electrode 150, and the corrugation of the corrugated surface 111 according to the first embodiment of the present invention also applies to the support substrate 210, the transparent electrode 230, the organic thin film layer 240, the cathode electrode 250, and the corrugation of the corrugated surface 211 according to the current embodiment of the present invention, and thus description thereof will be omitted. Hereinafter, the configuration of the highly refractive layer 220 will be described in detail.

(Highly Refractive Layer 220)

As described above, the highly refractive layer 220 has a two-layer structure including the light diffusion layer 221 and the planarization layer 223. As long as the highly refractive layer 220 does not hinder the functions of the light diffusion layer 221 and the planarization layer 223, the highly refractive layer 220 may further include an intermediate layer (not shown) between the light diffusion layer 221 and the planarization layer 223.

<Light Diffusion Layer 221>

The light diffusion layer 221 is formed on the corrugated surface 211 of the support substrate 210 and has the function of diffusing light that is incident from the transparent electrode 230, by using corrugated form of the corrugated surface 211. The diffusion function is the same as the diffusion function of the highly refractive layer 120 according to the first embodiment. The light diffusion layer 221 may be formed by using the above-described glass paste composite. In this case, a refractive index of a glass frit may be equal to or greater than a refractive index of the support substrate 210; in detail, the refractive index of the glass frit may be about 1.6 or greater and about 2.0 or less.

In addition, bubbles need not be actively removed from the light diffusion layer 221. This is because the planarization layer 223 is disposed between the light diffusion layer 221 and the transparent electrode 230 in order to increase a degree of planarization of an interface between the highly refractive layer 220 and the transparent electrode 230. Accordingly, the glass paste composite needs be sintered not in a vacuum or under a pressure when forming the light diffusion layer 221.

<Planarization Layer 223>

The planarization layer 223 includes the planarized surface 223a formed between the planarization layer 223 and the transparent electrode 230 and increases a manufacture yield of the surface light emitting device 200 and has the function of improving the lifespan and reliability of the surface light emitting device 200. Accordingly, bubbles in the planarization layer 223 need be actively removed, and thus when forming the planarization layer 223, a glass paste composite is to be sintered in a vacuum or under a pressure.

In addition, a refractive index of a glass frit included in the glass paste composite for forming the planarization layer 223 needs to be equal to or greater than a refractive index of the support substrate 210. If the refractive indices of the light diffusion layer 221 and the planarization layer 223 are the same as that of the support substrate 210, a degree of reflection in the interface between the transparent electrode 230 and the highly refractive index layer 220 is the same as when the corrugated surface 211 and the highly refractive layer 220 are not formed, and thus a light extraction efficiency may not be improved. Also, the refractive index of the glass frit for forming the planarization layer 223 may be equal to or greater than that of the transparent electrode 230. In detail, the refractive index of the planarization layer 223 of the surface light emitting device 200 may be about 1.7 to about 2.5. Alternatively, the refractive index nd1 of a glass frit for forming the planarization layer 230 (e.g., measured at the yellow doublet sodium D-line, with a wavelength of 589 nanometers), and a refractive index nd2 of the transparent electrode 230 (which may include, for example, ITO) needs to satisfy the following inequality: nd1/nd2≥0.9. The reason for the above condition is as described above with reference to FIG. 4.

<Planarization of Interface Between the Planarization Layer 223 and the Transparent Electrode 230>

When manufacturing the planarization layer 223 having the above-described configuration, formation of bubbles in the planarization layer 223 after sintering may be significantly prevented by sintering the glass paste composite described above in a vacuum or under a pressure. In detail, the number of bubbles existing in the highly refractive layer 120 due to the sintering in a vacuum or under a pressure may be reduced, and the size of the bubbles may also be reduced. By preventing formation of bubbles in the planarization layer 223, planarization of a surface of the planarization layer 223 adjacent to the transparent electrode 230, that is, planarization of the interface between the planarization layer 223 and the transparent electrode 230 may be remarkably improved. Also, as the planarization of the interface between the planarization layer 223 and the transparent electrode 230 is improved, a manufacture yield of the surface light emitting device 200 may be improved; in addition, since a current leakage is prevented, the lifespan and reliability of the surface light emitting device 200 are also improved. Moreover, planarization that is required for the interface between the planarization layer 223 and the transparent electrode 230 is the surface roughness Ra of the surface of the planarization layer 223 adjacent to the transparent electrode 230, that is, 30 nm or less, and preferably, 1 nm or less.

Here, as one of indices of a degree of preventing formation of bubbles in the planarization layer 223, the above-described Haze value is used. That is, a Haze value of the planarization layer 223 adjacent to the transparent electrode 230 in the substrate for a light emitting device for the surface light emitting device 200 according to the current embodiment is 5% or less. If the haze value of the planarization layer 223 exceeds 5%, the number of bubbles in the planarization layer 223 increases and sizes of thereof also increase. Thus, sufficient planarization of the interface between the planarization layer 223 and the transparent electrode 230 may not be provided.

In addition, although the haze value of the planarization layer 223 may be measured by using a transmission meter on which a light integrating sphere system is attached or a haze meter, which may be obtained from a market, as the haze value of the planarization layer 223, a single haze value of the planarization layer 223 and not the whole value of the substrate for the surface light emitting device 200 is used.

Also, according to the current embodiment, a more direct index, to which a diameter of bubbles or a ratio of the bubbles among the planarization layer 223 is applied, may also be used as the index of degree of preventing bubbles inside the planarization layer 223. In this case, a diameter of the bubbles existing inside the planarization layer 223 is 1/10th or less of a thickness of the planarization layer 223 adjacent to the transparent electrode 230, preferably, 1/100th or less. In addition, an absolute value of the bubble diameter may preferably be 5 μm or less, and more preferably, 0.5 μm or less.

Here, the diameter of bubbles existing in the planarization layer 223 refers to a diameter of a circle while assuming the bubbles are circular or an average of diameters of all bubbles that are included in sight when observing the planarization layer 223 by using an optical microscope.

In addition, a ratio of the bubbles among the planarization layer 223 adjacent to the transparent electrode 230 refers to a ratio of a surface area of a horizontal cross-section of bubbles with respect to the entire horizontal surface area of the planarization layer 223, which is 0.5% or less, or may be a ratio of a surface area of a vertical cross-section of bubbles with respect to the entire vertical cross-sectional area of the planarization layer 223, which is 0.5% or less. Preferably, the ratio of the bubbles in the planarization layer 223 may be a ratio of a surface area of a horizontal cross-section of bubbles with respect to the entire horizontal cross-sectional area of the planarization layer 223 of 0.1% or less, or may be a ratio of a surface area of a vertical cross-section of bubbles with respect to the entire vertical cross-sectional area of the planarization layer 223 of 0.1% or less.

Here, the surface area of a horizontal (vertical) cross-section of bubbles refers to a surface area of a horizontal (vertical) cross-section of the bubbles while assuming the bubbles are spheres.

If the diameter of the bubbles existing in the planarization layer 223 and the ratio thereof in the planarization layer 223 exceed the above ranges, a probability that bubbles in the planarization layer 223 may protrude from the surface of the planarization layer 223 toward the transparent electrode 230 increases, and this makes it difficult to provide sufficient planarization of the interface between the planarization layer 223 and the transparent electrode 230.

On the other hand, if the diameter of the bubbles existing in the planarization layer 223 and the ratio thereof among the planarization layer 223 are both within the above ranges, the planarization of the interface between the planarization layer 223 and the transparent electrode 230 may be further improved.

The highly refractive layer 220 is substantially the same as the highly refractive layer 120, and thus, any repetitive detailed description thereof will be omitted.

[Method of Manufacturing the Surface Light Emitting Device 200]

Figure 9:
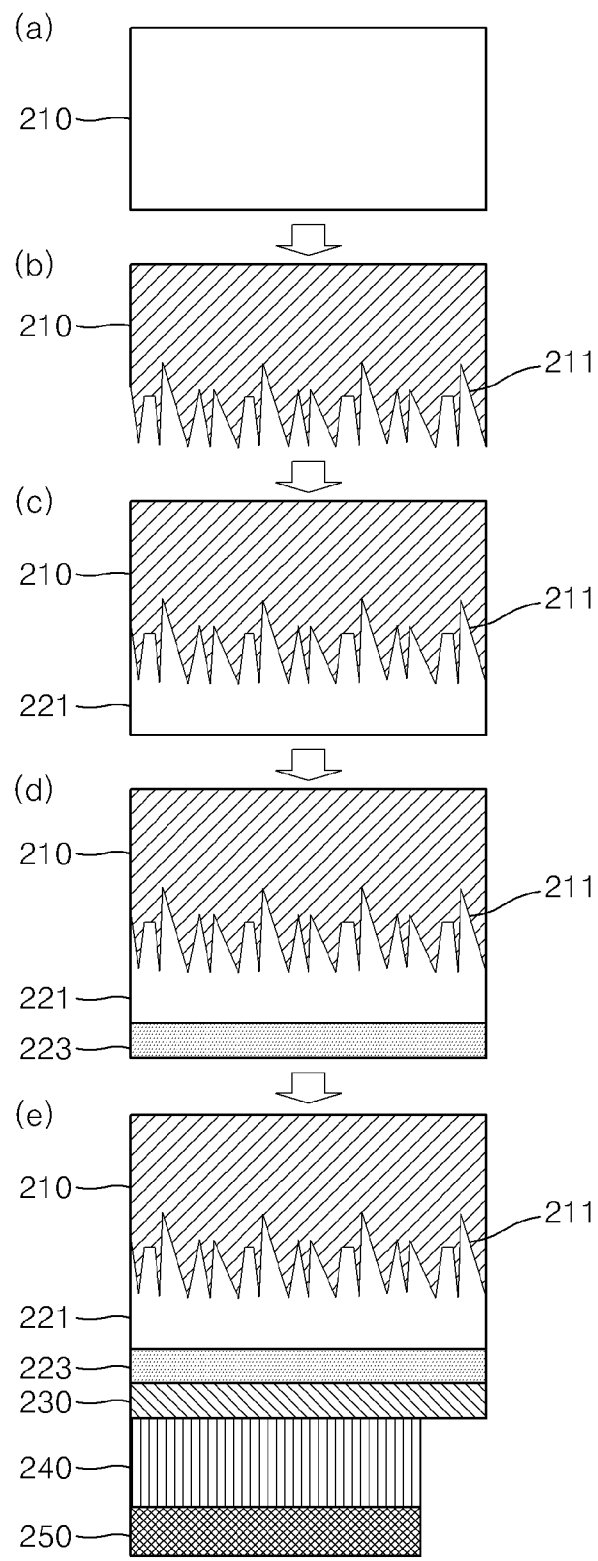
FIG. 9 illustrates a method of manufacturing a surface light emitting device according to another embodiment of the present invention.

Hereinafter, an alternative embodiment of a method of manufacturing the surface light emitting device 200 will now be described with reference to FIG. 9. FIG. 9 is illustrates a method of manufacturing a surface light emitting device 200 according to another embodiment of the present invention.

The method of manufacturing the surface light emitting device 200 may include a surface roughening process, a coating operation, a drying operation, and a sintering operation. In the surface roughening operation, the corrugated surface 211 is formed on a surface of the support substrate 210. In the coating operation, a glass paste composite including a glass frit that has a refractive index that is equal to or greater than that of the support substrate 210; a solvent; and a resin is coated on the surface of the support substrate 210 on which the corrugated surface 211 is formed. In the drying operation, the glass paste composite coated on the support substrate 210 is dried to volatilize the solvent. In the sintering operation, the glass paste composite after the solvent is volatilized is sintered in a vacuum or under a pressure to remove away the resin and fuse the glass frit at the same time, thereby forming the highly refractive layer 220 on the support substrate 210. Hereinafter, the method of manufacturing the surface light emitting device 200 including these operations will now be described.

(Surface Roughening Process)

As illustrated in FIG. 9, the non-uniform corrugated surface 211 (refer to (b) FIG. 9) which scatters refraction angle of incident light that is generated from the organic thin film layer 240 and enters the support substrate 210 through the transparent conductive layer 130 is formed on a surface (refer to (a) of FIG. 9) of the support substrate 210 including soda lime glass or non-alkali glass (refer to (b) FIG. 9) by sand blasting or etching (a frost method). In detail, the surface roughening process may be performed in the same manner as described with reference to the first embodiment.

(Preparation of the Glass Paste Composite)

Next, the glass paste composite including a glass frit, a solvent and a resin, which are described above, is prepared. The method of preparing the glass frit composite is the same as described with reference to the first embodiment.

According to the current embodiment of the present invention, since the highly refractive layer 220 has a two-layer structure including the light diffusion layer 221 and the planarization layer 223, glass paste composites are formed respectively for the light diffusion layer 221 and the planarization layer 223. Here, the same glass frit composites may be formed for the light diffusion layer 221 and the planarization layer 223 or different ones may be used. In addition, as a glass frit to be contained in a glass paste composite for at least the planarization layer 223, a glass frit having a refractive index equal to or greater than that of the transparent electrode 230 may be used.

(Coating Operation, Drying Operation, and Sintering Operation)

Next, a surface of the corrugated surface 211 of the support substrate 210 is coated with the glass paste composite prepared for the light diffusion layer 221. The coating method of the glass paste composite is not limited, and may be, for example, a coating method, a doctor blade, a slit coating method, a die coating method, or the like.

Next, the solvent is removed by moving the support substrate 210 including the corrugated surface 211 coated with the glass paste composite, in a hot air dryer. Here, as described above, a drying temperature may be about 500° C. or less so that the support substrate 210 is not melted. In detail, the drying temperature may preferably be about 100° C. or greater or 150° C. or less.

After the sintering operation is performed, the support substrate 210 may be transferred to a furnace to sinter the same at a temperature in a range between the glass transition temperature Tg and the softening temperature Ts of the glass frit such that the binder resin is removed and simultaneously the glass frit is fused in a furnace by sintering the support substrate 210, from which the solvent is removed (refer to (c) of FIG. 9).

Also, the planarization layer 223 is formed on the surface of the support substrate 210 by repeating the coating operation, the drying operation, and the sintering operation used to form the light diffusion layer 221 (refer to (d) of FIG. 9). The sintering operation when forming the planarization layer 223 is performed by using the same sintering operation as when forming the highly refractive layer 120 according to the first embodiment, in a vacuum or under a pressure. Thus, formation of bubbles in the planarization layer 223 after the sintering operation may be significantly prevented. By preventing formation of bubbles in the planarization layer 223, planarization of the interface between the planarization layer 223 and the transparent electrode 230 is remarkably increased, thereby increasing a manufacture yield of the surface light emitting device 200 and the lifespan and reliability of the surface light emitting device 200.

(Formation of the Transparent Electrode 230, the Organic Thin Film Layer 240, and the Cathode Electrode 250)

Next, the transparent electrode 230 is provided on the support substrate 210, the surface of which is planarized by the highly refractive layer 220 (particularly by the planarization layer 230) by spin coating, sputtering, etc. using a material selected from the group consisting of ITO, IZO, ZnO, In$_2$O$_3$ and a combination thereof. Also, the surface light emitting device 200 having the organic thin film layer 240 including a hole transport layer and a light emitting layer may be provided by depositing a hole transport material or a light emitting material on the transparent electrode 230 after forming the organic thin film layer 240, and by forming the cathode electrode 250 by depositing a metal, e.g., Ag, Mg and Al on the organic thin film layer 240 (refer to (e) of FIG. 9). In addition, the organic thin film layer 240 and the cathode electrode 250 may be provided using methods as described with reference to the first embodiment.

Third Embodiment

Configuration of the Surface Light Emitting Device 300

Figure 10:
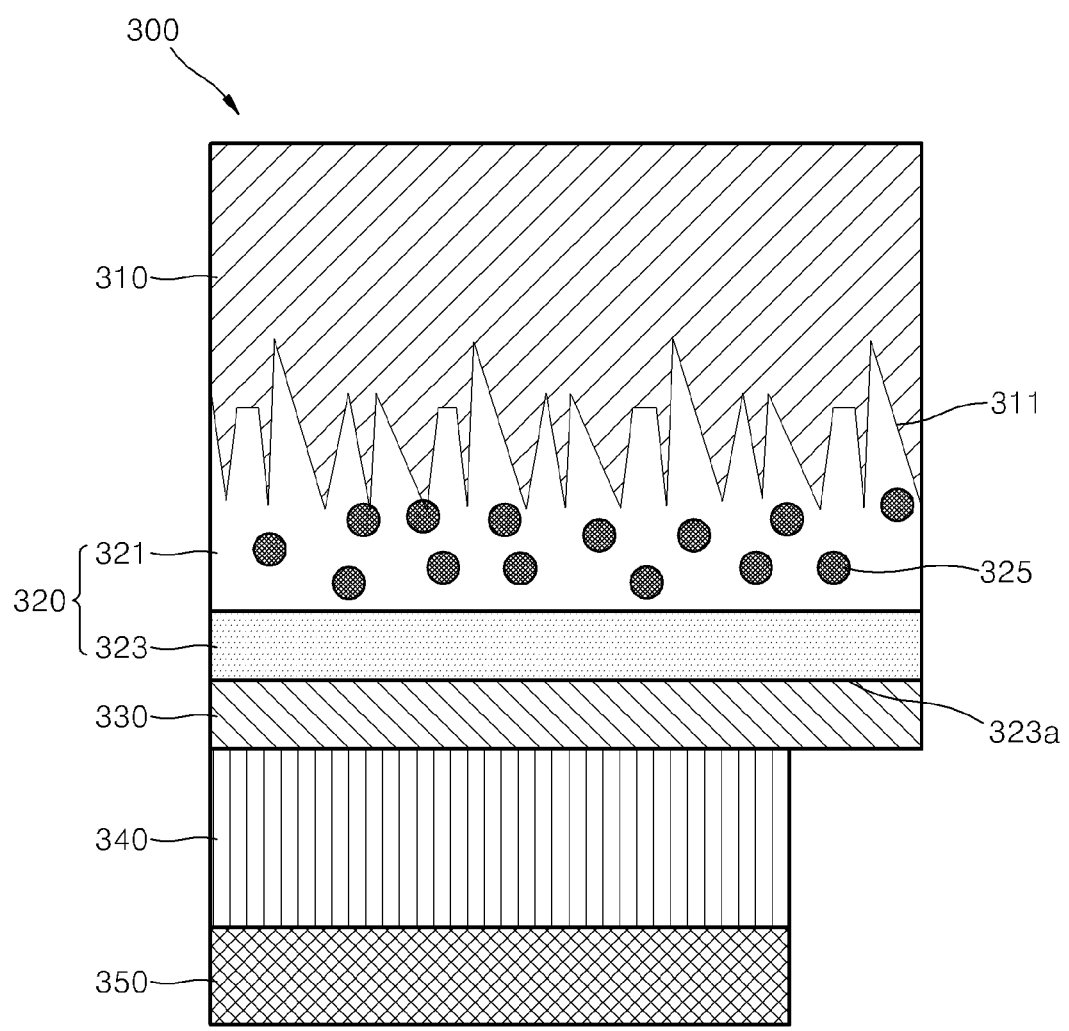
FIG. 10 is a cross-sectional view of the surface light emitting device of FIG. 3 according to another embodiment of the present invention.

Next, referring to FIG. 10, the configuration of a surface light emitting device 300 according to a third embodiment of the present invention will be described. FIG. 10 is a cross-sectional view of the surface light emitting device 300 according to another embodiment of the present invention.

Referring to FIG. 10, the surface light emitting device 300 may include a support substrate 310, a highly refractive layer 320, a transparent electrode (transparent conductive layer) 330, an organic thin film layer 340, and a cathode electrode 350. A substrate for a light emitting device may include the support substrate 310 and the highly refractive layer 320.

A corrugated surface 311 is formed on a surface of the support substrate 310, and the surface light emitting device 300 has a structure in which a surface of the corrugated surface 311 (surface that contacts the transparent electrode 330) is planarized by the highly refractive layer 320. In addition, the highly refractive layer 320 of the surface light emitting device 300 includes two layers, that is, a light diffusion layer 321 that is adjacent to the support substrate 310 and includes a light diffusion unit that diffuses light incident from the transparent electrode 330 and a planarization layer 323 that has a planarized surface 323a that is adjacent to the transparent electrode 330. As such, functions of the highly refractive layer 320 according to the current embodiment of the present invention are divided into the two layers; that is, a function of diffusing light incident from the transparent electrode 330 is allocated to the light diffusion layer 321, and a function of allowing an interface between the highly refractive layer 320 and the transparent electrode 330 to have a high degree of planarization to increase a yield of the surface light emitting device 300 is allocated to the planarization layer 323.

In addition, in the surface light emitting device 300, in order to effectively diffuse light that is incident from the light diffusion layer 321 and to improve a light extraction efficiency, the light diffusion layer 321 may further include a diffusion material 325 having a different refractive index from that of a glass material (glass frit) in addition to the glass material.

The description of the support substrate 110, the transparent electrode 130, the organic thin film layer 140, the cathode electrode 150, and the corrugation of the corrugated surface 111 according to the first embodiment of the present invention also applies to the support substrate 310, the transparent electrode 330, the organic thin film layer 340, the cathode electrode 350, and the corrugation of the corrugated surface 311 according to the current embodiment of the present invention, and thus description thereof will be omitted. Hereinafter, the configuration of the highly refractive layer 320 will be described in detail.

(Highly Refractive Layer 320)

As described above, the highly refractive layer 320 has a two-layer structure including the light diffusion layer 321 and the planarization layer 323. In addition to the glass material, the highly refractive layer 320 further includes the diffusion material 325 having a different refractive index from that of the glass material, among the light diffusion layer 321. In other words, the highly refractive layer 320 is different from the highly refractive layer 220 according to the second embodiment only in that the diffusion material 325 is further included. As long as the highly refractive layer 320 does not hinder the functions of the light diffusion layer 321 and the planarization layer 323, the highly refractive layer 320 may further include an intermediate layer (not shown) between the light diffusion layer 321 and the planarization layer 323.

<Light Diffusion Layer 321>

The light diffusion layer 321 is formed on the corrugated surface 311 of the support substrate 310 and has the function of diffusing light that is incident from the transparent electrode 330, by using the corrugated form of the corrugated surface 311. The diffusion function is the same as the diffusion function of the highly refractive layer 120 according to the first embodiment. The light diffusion layer 321 may be formed by using the above-described glass paste composite. In this case, a refractive index of a glass frit may be equal to or greater than that of the support substrate 310; in detail, the refractive index of the glass frit may be about 1.6 or greater and about 2.0 or less.

In addition, bubbles needs not be actively removed from the light diffusion layer 321. This is because the planarization layer 323 is disposed between the light diffusion layer 321 and the transparent electrode 330 in order to increase a degree of planarization of an interface between the highly refractive layer 320 and the transparent electrode 330. Accordingly, the glass paste composite needs not be sintered in a vacuum or under a pressure when forming the light diffusion layer 321.

The light diffusion layer 321 includes the diffusion material 325. The diffusion material 325 is not limited as long as it has a different refractive index from that of a glass frit for forming the light diffusion layer 321. Examples of the diffusion material 325 include organic materials such as $TiO_2$, $SiO_2$, $Al_2O_3$, ZnO. ZnS, $PbTiO_2$, ZnTe, $Pb_3O_3$, $PbCrO_4$, $ZnCrO_4$, $Cr_2O_3$, $ZrO_2$, $WO_3$, $SrTiO_3$, $Y_2O_3$, $Eu_2O_3$, $La_2O_3$, and $ZrSiO_4$. The diffusion material 325 may be formed of a single material or a combination of at least two materials.

The diffusion material 325 may be contained in the glass paste composite for forming the light diffusion layer 321 in about 0.1 volume % to about 74 volume %. Preferably, the diffusion material 325 may be contained in about 1 volume % to about 30 volume %. If the content of the diffusion material 325 is less than 0.1 volume %, the effect of increasing light diffusion is not sufficient; if the content of the diffusion material 325 is greater than 74 volume % (closely packed state), it is difficult to maintain the form of the highly refractive layer 320 after performing the sintering.

<Planarization Layer 323>

The planarization layer 323 includes the planarized surface 323a formed between the planarization layer 323 and the transparent electrode 330 to increase a manufacture yield of the surface light emitting device 300 and has a function of improving the lifespan and reliability of the surface light emitting device 300. Accordingly, bubbles in the planarization layer 323 need be actively removed, and thus when forming the planarization layer 323, a glass paste composite is to be sintered in a vacuum or under a pressure.

Other configurations of the planarization layer 323 are the same as those of the planarization layer 223 according to the second embodiment. Also, other configurations of the highly refractive layer 320 are the same as those of the highly refractive layer 120 according to the first embodiment. Thus, detailed description thereof will be omitted.

[Method of Manufacturing the Surface Light Emitting Device 300]

Figure 11:
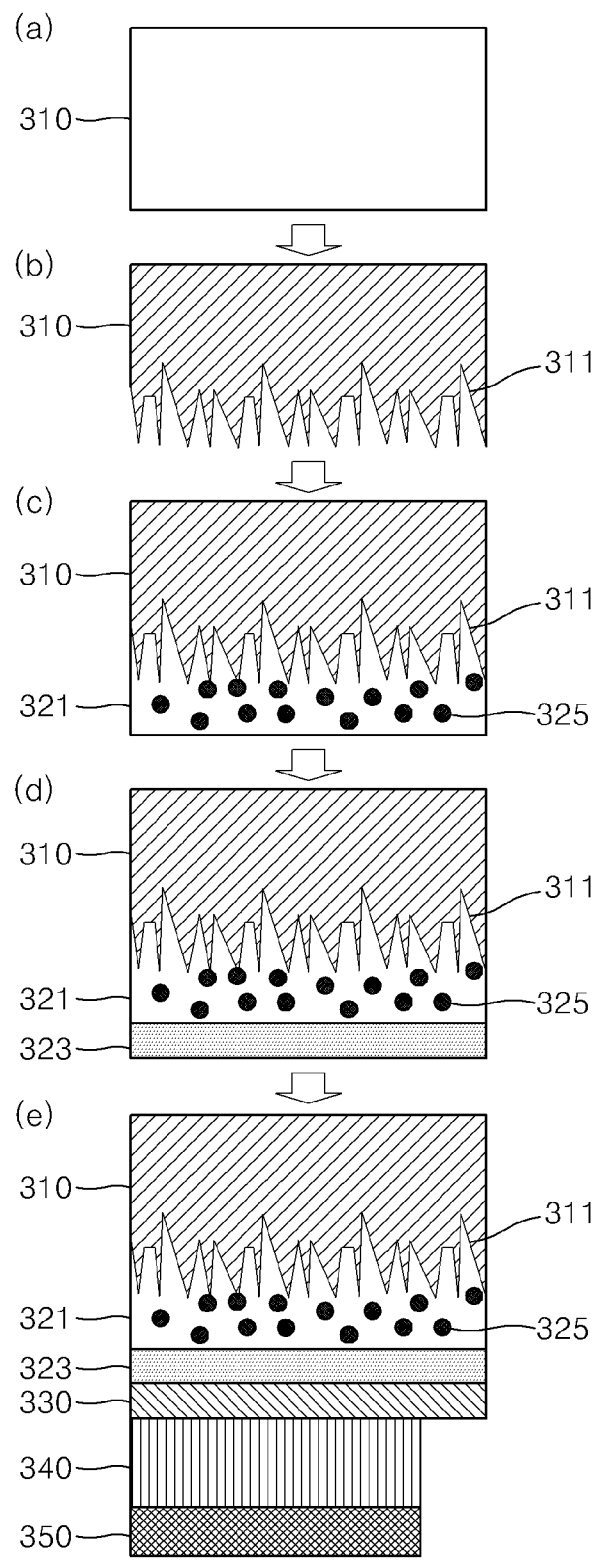
FIG. 11 illustrates a method of manufacturing a surface light emitting device of FIG. 10 according to another embodiment of the present invention.

Hereinafter, an alternative embodiment of a method of manufacturing the surface light emitting device 300 will now be described with reference to FIG. 11. FIG. 11 illustrates a method of manufacturing the surface light emitting device 300 according to the third embodiment of the present invention.

The method of manufacturing the surface light emitting device 300 may include a surface roughening process, a coating operation, a drying operation, and a sintering operation. In the surface roughening operation, the corrugated surface 311 is formed on a surface of the support substrate 310. In the coating operation, a glass paste composite including a glass frit that has a refractive index that is equal to or greater than that of the support substrate 310; a solvent; and a resin is coated on the surface of the support substrate 310 on which the corrugated surface 311 is formed. In the drying operation, the glass paste composite coated on the support substrate 310 is dried to volatilize the solvent. In the sintering operation, the glass paste composite after the solvent is volatilized is sintered in a vacuum or under a pressure to remove away the resin and simultaneously fuse the glass frit, thereby forming the highly refractive layer 320 on the support substrate 310. Hereinafter, the method of manufacturing the surface light emitting device 300 including these operations will now be described.

(Surface Roughening Process)

As illustrated in FIG. 11, the non-uniform corrugated surface 311 (refer to (a) FIG. 11) which scatters refraction angle of incident light that is generated from the organic thin film layer 340 and enters the support substrate 310 through the transparent electrode 330 on a surface (refer to (a) of FIG. 11) of the support substrate 310 including soda lime glass or non-alkali glass (refer to (b) FIG. 11) by sand blasting or etching (a frost method). In detail, the surface roughening process may be performed in the same manner as described with reference to the first embodiment.

(Preparation of the Glass Paste Composite)

Next, a glass paste composite that includes a glass frit, a solvent and a resin, which are described above, is prepared. The method of preparing the glass frit composite is the same as described with reference to the second embodiment.

According to the current embodiment of the present invention, since the highly refractive layer 320 has a two-layer structure including the light diffusion layer 321 and the planarization layer 323, glass paste composites are formed respectively for the light diffusion layer 321 and the planarization layer 323, and the above-described diffusion material 325 is to be included in the glass paste composite for forming the planarization layer 323. The type and content of the diffusion material 325 that may be used are as described above. Thus, unlike the second embodiment, the glass paste composites for the light diffusion layer 321 and the planarization layer 323 may not be the same. In addition, as a glass frit to be contained in the glass paste composite for at least the planarization layer 323, a glass frit having a refractive index equal to or greater than that of the transparent electrode 330 may be used.

(Coating Operation, Drying Operation, and Sintering Operation)

Next, a surface of the corrugated surface 311 of the support substrate 310 is coated with the glass frit paste composite prepared for the light diffusion layer 321. The coating method of the glass paste composite is not limited, and may be, for example, a coating method, a doctor blade, a slit coating method, a die coating method, or the like.

Next, the solvent is removed by moving the support substrate 310 including the corrugated surface 311 coated with the glass paste composite, in a hot air dryer. Here, as described above, a drying temperature may be about 500° C. or less so that the support substrate 310 is not melted. In detail, the drying temperature may preferably be about 100° C. or greater or about 150° C. or less.

After the drying operation is performed, the support substrate 310, from which the solvent is removed, may be transferred to a furnace to sinter the same at a temperature in a range between the glass transition temperature Tg and the softening temperature Ts of the glass frit such that the binder resin is removed away and simultaneously the glass frit is fused. Also, the light diffusion layer 321 is formed on the surface of the support substrate 310 by sintering at a temperature equal to or greater than the softening temperature Ts of the glass frit (which may be 500° C. or less) (refer to (c) of FIG. 11).

Also, the planarization layer 323 is formed on the surface of the support substrate 310 by repeating the coating operation, the drying operation, and the sintering operation used to form the light diffusion layer 321 (refer to (d) of FIG. 11). The sintering operation used to form the planarization layer 323 is performed by using the same sintering operation used to form the highly refractive layer 120 according to the first embodiment, in a vacuum or under a pressure. Thus, formation of bubbles in the planarization layer 323 after the sintering operation may be significantly prevented. By preventing formation of bubbles in the planarization layer 323, planarization of the interface between the planarization layer 323 and the transparent electrode 330 is remarkably increased, thereby increasing a manufacture yield of the surface light emitting device 300, and also the lifespan and reliability of the surface light emitting device 300.

(Formation of the Transparent Electrode 330, the Organic Thin Film Layer 340, and the Cathode Electrode 350)

Next, the transparent electrode 330 is provided on the support substrate 310, the surface of which is planarized by the highly refractive layer 320 (particularly by the planarization layer 330) by spin coating, sputtering, etc. using a material selected from the group consisting of ITO, IZO, ZnO, $In_2O_3$ and a combination thereof. Also, the surface light emitting device 300 having the organic thin film layer 340 including a hole transport layer and a light emitting layer may be provided by depositing a hole transport material or a light emitting material on the transparent conductive layer 330 after forming the organic thin film layer 340, and by forming the cathode electrode 350 on the organic thin film layer 340 by depositing a metal, e.g., Ag, Mg and Al (refer to (e) of FIG. 11). In addition, the organic thin film layer 340 and the cathode electrode 350 may be provided using methods as described with reference to the first embodiment.

Fourth Embodiment

Configuration of the Surface Light Emitting Device 400

Figure 12:
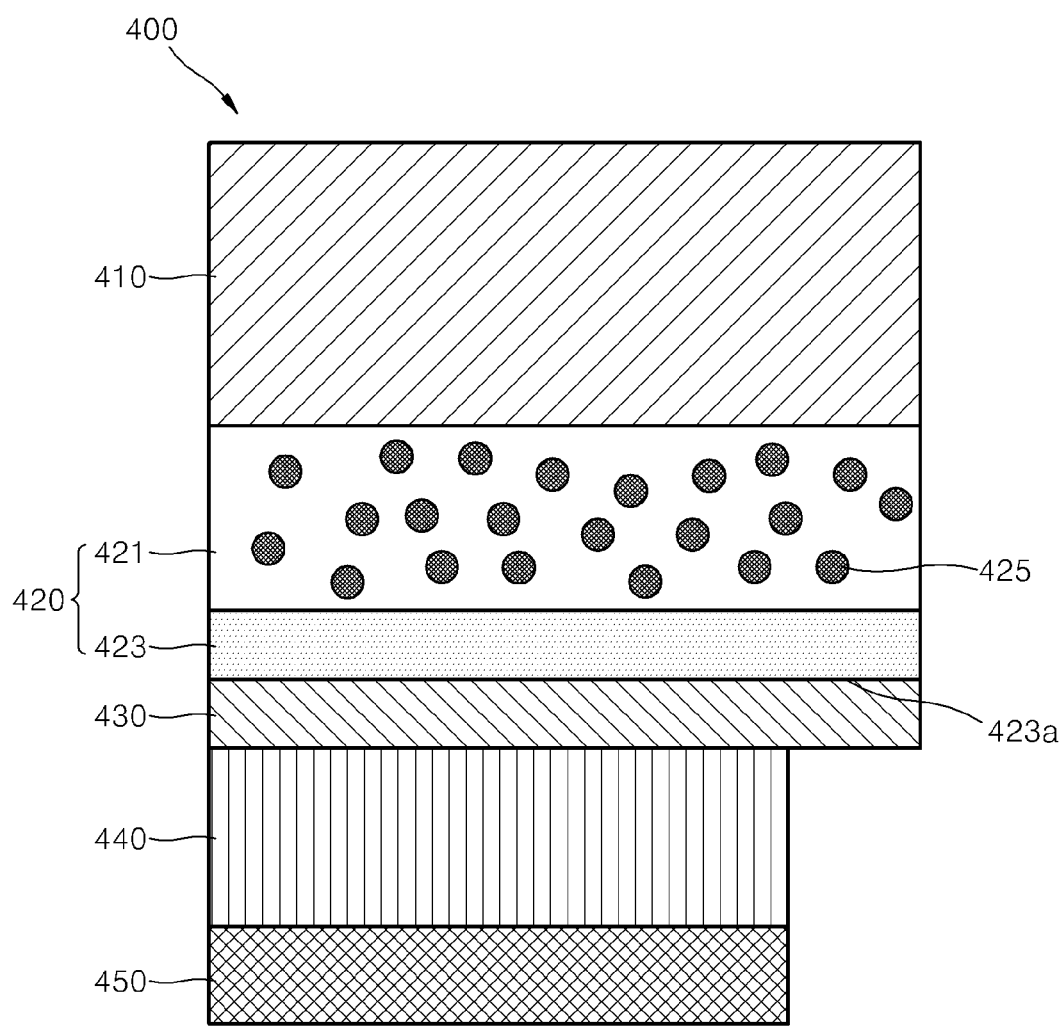
FIG. 12 is a cross-sectional view of a surface light emitting device according to another embodiment of the present invention.

Next, referring to FIG. 12, the configuration of a surface light emitting device 400 according to a fourth embodiment of the present invention will be described. FIG. 12 is a cross-sectional view of the surface light emitting device 400 according to another embodiment of the present invention.

Referring to FIG. 12, the surface light emitting device 400 may include a support substrate 410, a highly refractive layer 420, a transparent electrode (transparent conductive layer) 430, an organic thin film layer 440, and a cathode electrode 450. A substrate for a light emitting device may include the support substrate 410 and the highly refractive layer 420.

Not a corrugated surface but the highly refractive layer 420 is formed on a relatively planar surface of the support substrate 410 of the surface light emitting device 400. The highly refractive layer 420 of the surface light emitting device 400 includes two layers, that is, a light diffusion layer 421 that is adjacent to the support substrate 410 and includes a light diffusion unit that diffuses light incident from the transparent electrode 430 and a planarization layer 423 that has a planarized surface 423a that is adjacent to the transparent electrode 430. As such, functions of the highly refractive layer 420 according to the current embodiment of the present invention are divided into the two layers; that is, a function of diffusing light incident from the transparent electrode 430 is allocated to the light diffusion layer 421, and a function of allowing an interface between the highly refractive layer 420 and the transparent electrode 430 to have a high degree of planarization to increase of a yield of (the surface light emitting device?) is allocated to the planarization layer 423. By dividing the functions of the highly refractive layer 220 into the two layers, each function may be performed with a higher level.

In addition, in the surface light emitting device 400, in order to give the light diffusion layer 421 a function of diffusing incident light, the light diffusion layer 421 may further include a diffusion material 425 having a different refractive index from that of a glass material (glass frit) in addition to the glass material.

The description of the transparent electrode 130, the organic thin film layer 140, and the cathode electrode 150 according to the first embodiment also applies to the transparent electrode 430, the organic thin film layer 440, and the cathode electrode 450 according to the current embodiment of the present invention, and thus description thereof will be omitted. Hereinafter, the configuration of the support substrate 410 and the highly refractive layer 420 will be described in detail.

(Support Substrate 410)

Unlike the first through fourth embodiments, the support substrate 410 does not have a corrugated surface. Thus, a light diffusion function is performed in the highly refractive layer 420 not by a corrugated surface of the support substrate 410 but by including the diffusion material 425 having a different refractive index from that of a glass frit for forming the light diffusion layer 421, among the light diffusion layer 421. Except that a corrugated surface is not formed, the support substrate 410 is the same as the support substrate 110 according to the first embodiment.

(Highly Refractive Layer 420)

As described above, the highly refractive layer 420 has a two-layer structure including the light diffusion layer 421 and the planarization layer 423. In addition to the glass material, the highly refractive layer 420 further includes the diffusion material 425 having a different refractive index from that of the glass material, among the light diffusion layer 421. In other words, the highly refractive layer 420 is completely the same as the highly refractive layer 320 according to the third embodiment, except that the form of the surface of the support substrate 410 on which the highly refractive layer 420 is formed is different. As long as the highly refractive layer 420 does not hinder the functions of the light diffusion layer 421 and the planarization layer 423, the highly refractive layer 420 may further include an intermediate layer (not shown) between the light diffusion layer 421 and the planarization layer 423.

<Light Diffusion Layer 421>

The light diffusion layer 421 is formed on the surface of the support substrate 410 and contains the light diffusion material 425. Thus, as the diffusion material 425 is dispersed in the light diffusion layer 421, the light diffusion layer 421 has the function of diffusing light that is incident from the transparent electrode 430. The light diffusion layer 421 may be formed by using the above-described glass paste composite. In this case, a refractive index of a glass frit may be equal to or greater than a refractive index of the support substrate 410; in detail, the refractive index of the glass frit may be about 1.4 or greater and about 2.0 or less.

Bubbles needs not be actively removed from the light diffusion layer 421. This is because the planarization layer 423 is disposed between the light diffusion layer 421 and the transparent electrode 430 in order to increase a degree of planarization of an interface between the highly refractive layer 420 and the transparent electrode 430. Accordingly, the glass paste composite needs be sintered not in a vacuum or under a pressure when forming the light diffusion layer 421.

The light diffusion layer 421 includes the diffusion material 425. The type and content of the diffusion material 425 is as described with reference to the third embodiment <Planarization Layer 423>

The planarization layer 423 includes a planarized surface 423*a* formed between the planarization layer 423 and the transparent electrode 430 to increases a manufacture yield of the surface light emitting device 400 and has the function of improving the lifespan and reliability of the surface light emitting device 400. Accordingly, bubbles in the planarization layer 423 need be actively removed, and thus when forming the planarization layer 423, a glass paste composite is to be sintered in a vacuum or under a pressure.

In addition, other configurations of the planarization layer 423 are the same as those of the planarization layer 223 according to the second embodiment. Also, other configurations of the highly refractive layer 420 are the same as those of the highly refractive layer 120 according to the first embodiment. Thus, detailed description thereof will be omitted.

[Method of Manufacturing the Surface Light Emitting Device 400]

Figure 13:
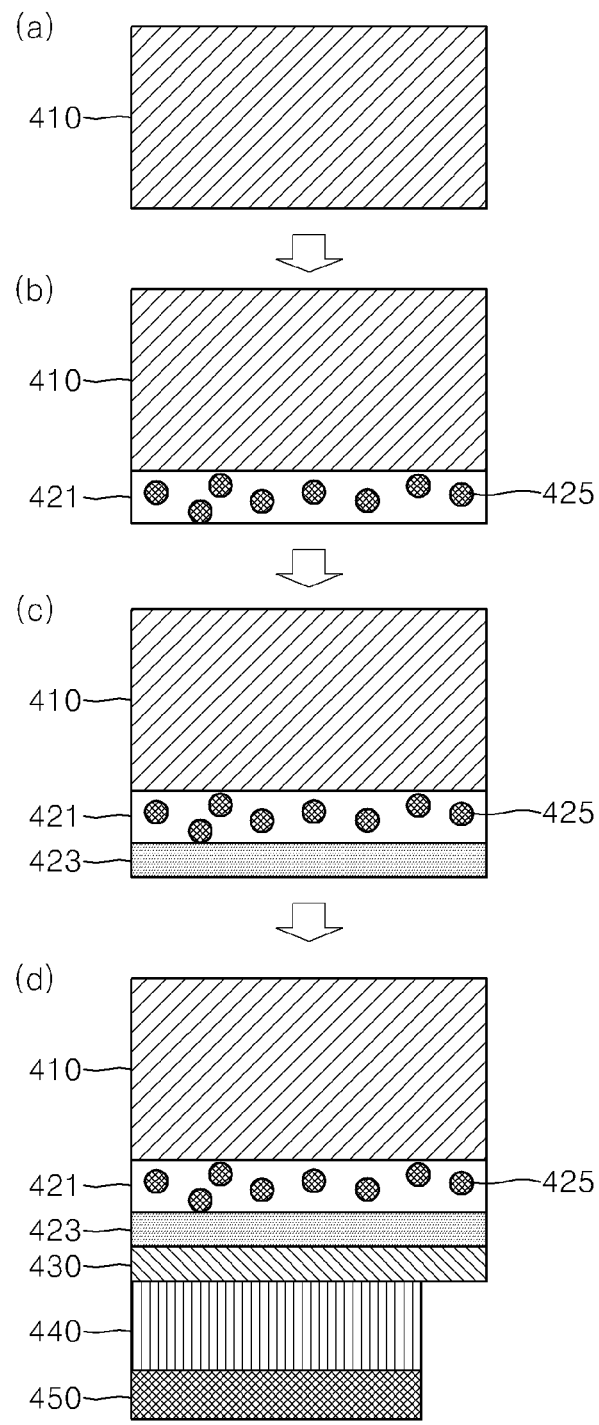
FIG. 13 illustrates a method of manufacturing the surface light emitting device of FIG. 12.

Hereinafter, an alternative embodiment of a method of manufacturing the surface light emitting device 400 will now be described with reference to FIG. 13. FIG. 13 is illustrates a method of manufacturing a surface light emitting device 400 according to another embodiment of the present invention.

The method of manufacturing the surface light emitting device 400 may include a coating operation, a drying operation, and a sintering operation. Unlike the above-described first through third embodiments, a surface roughening operation is not included. In the coating operation, a glass paste composite including a glass frit that has a refractive index that is equal to or greater than that of the support substrate 410; a solvent; and a resin is coated on the surface of the support substrate 410. In the drying operation, the glass paste composite coated on the support substrate 410 is dried to volatilize the solvent. In the sintering operation, the glass paste composite after the solvent is volatilized is sintered in a vacuum or under a pressure to remove away the resin and simultaneously fuse the glass frit, thereby forming the highly refractive layer 420 on the support substrate 410. Hereinafter, the method of manufacturing the surface light emitting device 400 including these operations will now be described.

(Preparation of the Glass Paste Composite)

Next, the glass paste composite that includes a glass frit, a solvent and a resin, which are described above, is prepared. The method of preparing the glass frit composite is the same as described with reference to the third embodiment.

(Coating Operation, Drying Operation, and Sintering Operation)

Next, a surface of the support substrate 410 is coated with the glass paste composite prepared for the light diffusion layer 421 (refer to (a) of FIG. 13). The coating method of the glass paste composite is not limited, and may be, for example, a coating method, a doctor blade method, a slit coating method, a die coating method, or the like.

Next, the solvent is removed by moving the support substrate 410 coated with the glass paste composite, in hot air dryer. Here, as described above, a drying temperature may be about 500° C. or less so that the support substrate 410 is not melted. Preferably, the drying temperature may be 100° C. or greater or 150° C. or less.

After the drying operation is performed, the support substrate 410, from which the solvent is removed, may be transferred to a furnace to sinter the same at a temperature in a range between the glass transition temperature Tg and the softening temperature Ts of the glass frit such that the binder resin is removed and simultaneously the glass frit is fused. Also, the light diffusion layer 421 is formed on the surface of the support substrate 410 by sintering at a temperature equal to or greater than the softening temperature Ts of the glass frit (which may be 500° C. or less) (refer to (b) of FIG. 13).

Also, the planarization layer 423 is formed on the surface of the support substrate 410 by repeating the coating operation, the drying operation, and the sintering operation used to form the light diffusion layer 421 (refer to (c) of FIG. 13). The sintering operation used to form the planarization layer 423 is performed in a vacuum or under a pressure by using the same sintering operation used to form the highly refractive layer 120 according to the first embodiment. Thus, formation of bubbles in the planarization layer 423 after the sintering operation may be significantly prevented. By preventing formation of bubbles in the planarization layer 423, planarization of the interface between the planarization layer 423 and the transparent electrode 430 is remarkably increased, thereby increasing a manufacture yield of the surface light emitting device 400, and also the lifespan and reliability of the surface light emitting device 400.

(Formation of the Transparent Electrode 430, the Organic Thin Film Layer 440, and the Cathode Electrode 450)

Next, the transparent electrode 430 is provided on the support substrate 410, the surface of which is planarized by the highly refractive layer 420 (particularly by the planarization layer 430) by spin coating, sputtering, etc. using a material selected from the group consisting of ITO, IZO, ZnO, $In_2O_3$ and a combination thereof. Also, the surface light emitting device 400 having the organic thin film layer 440 and the cathode electrode 450 may be provided. The organic thin film layer 440 including a hole transport layer and a light emitting layer is formed by depositing a hole transport material or a light emitting material on the transparent conductive layer 430. The cathode electrode 450 is formed by depositing a metal, e.g., Ag, Mg and Al (refer to (d) of FIG. 13) on the organic thin film layer 440 after forming the organic thin film layer 440. In addition, the organic thin film layer 440 and the cathode electrode 450 may be provided using methods as described with reference to the first embodiment.

SUMMARY

According to the surface light emitting devices 100, 200, 300, and 400 according to the first through fourth embodiments of the present invention, light which is totally internally reflected according to Snell's Law and thus cannot be extracted within the device may be extracted, thereby greatly improving light extraction efficiency of the surface light emitting device such as OLEDs.

According to the embodiments of the present invention, a corrugated structure which confuses refractive index of an interface between a support substrate and a highly refractive layer is installed or the diffusion material 425 is included in the highly refractive layer 420 to diffuse light so as to extract light through the front side of the highly refractive layer 420. Also, by forming a planarized surface in an interface between the transparent electrode and the highly refractive layer using a material having a refractive index equal to or greater than that of the transparent electrode, light extraction efficiency may be improved to about 1.5 times to about 2.0 times and a high yield may be obtained. Moreover, according to the method disclosed in the patent reference 4, if a diffusion component such as bubbles or fillers exist intentionally among a highly refractive glass, the highly refractive layer itself is used to function as a diffusion layer, and if there are bubbles or fillers in a bonded portion between the highly refractive layer and the transparent electrode, it is difficult to form a uniform transparent electrode. Thus, it is difficult to provide a long lifespan or reliability of the surface light emitting device. The patent reference 4 describes a method of intentionally not including bubbles in a surface of the highly refractive glass, but it is expected that not including bubbles is to be difficult. In addition, light cannot be controlled optically due to the bubbles. This problem implies that the surface light emitting device cannot be applied as a display including multiple, fine pixels.

On the other hand, according to the embodiments of the present invention, bubbles are excluded to the limit so as to prevent a decrease in the yield or a decrease in the lifespan or reliability of the surface light emitting device. As a method of actively excluding bubbles which is one of factors that decrease the yield, lifespan or reliability of the device, a sintering operation in a vacuum or under a pressure is included.

Also, to further planarize the interface between the transparent electrode and the highly refractive layer, which is planarized by the highly refractive layer, an OLED manufacturing operation is usually used, and a glass polishing operation may be performed before forming a transparent electrode. In addition, it is easily understood that if a polishing operation is included, and there are bubbles in the highly refractive layer to be polished, defects in the form of valleys are generated as a result of polishing portions including the bubbles, and several problems related to reliability such as bright points, dark points, or leakage are generated.

Embodiment

Hereinafter, the present invention will now be described in more detail with reference to embodiments, but the present invention is not limited thereto.

(Manufacture of the Substrate for Light Emitting Device)

First, a substrate for a light emitting device used as a substrate of an OLED or the like is manufactured.

In detail, a support substrate (also referred to as "corrugated substrate") may be obtained by spraying (sand blast) aluminum powder of #800 at a pressure of about 0.5 kilopascal (kPa) onto a soda lime glass having dimensions of 50 millimeter (mm)×50 millimeter (mm) and a thickness of about 0.7 mm. In such an embodiment, a surface of the corrugated substrate includes ridges having an average surface roughness Ra of about 0.7 µm when observed using a laser microscope (e.g., VK9510, a product of Keyence Co.). In such an embodiment, when the surface of the corrugated substrate was measured using a Hazemeter (e.g., Haze guard II which is a product of Dongyang precision machine Co.), an optical diffusing layer of the corrugated substrate has an optical transmittance of about 82% and a Haze value of about 91%.

In addition, a glass paste composite may be prepared by dissolving and mixing about 150 g of a glass frit (particle size distribution, expressed in terms of D50, is about 1.6 µm) of a $Bi_2O_3$—$B_2O_3$—$SiO_2$—ZnO group having a glass transition temperature Tg of about 400° C., about 3 g of ethylcellulose STD45 (a product of Dow chemical), about 32.9 g of terpineol, and about 14.1 g of butylcarbitolacetate, and then milling the same with three roll mills.

The obtained glass paste composite was coated on the corrugated substrate and a non-corrugated substrate (a soda lime glass substrate to which sand blasting is not performed) using a doctor blade, and then a solvent is removed using a hot air dryer at about 120° C. and transferred to a furnace and sintered at about 350° C. to remove a binder resin, and then sintered again at 500° C. for 30 minutes to thereby form a highly refractive layer, which is a transparent glass layer, on a surface of each substrate.

The thickness of the highly refractive layer formed on the non-corrugated substrate was measured using a stylus type film thickness meter (e.g., DEKTAK, a product of VLVAC Co.) The thickness was about 30 µm. Thus, as can be seen therefrom, a glass layer having a colorless, transparent, and smooth surface was formed. The average surface roughness Ra of the non-corrugated substrate, on which the highly refractive layer was formed, was about 30 nm or less.

When forming the highly refractive layer on the non-corrugated substrate, the substrate that was sintered in the air had a total light transmittance Tt of about 72.2% and a haze value of about 40.2% (refer to Table 2 (1)Air).

However, when forming the highly refractive layer on the non-corrugated substrate, the substrate that was sintered in a vacuum had a total light transmittance Tt of about 82.3% and a haze value of about 2.66% (refer to Table 2 (2)Vac).

Also, in addition, a polishing operation is further performed on the substrate which is sintered in a vacuum, in order to further planarize an outermost surface of the substrate, thereby forming a substrate that is sintered in a vacuum and polished.

Next, an ITO film having a thickness of about 120 nm was formed on the above-described substrate and the soda lime substrate using a radio frequency ("RF") magnetron sputtering apparatus.

Figure 14:
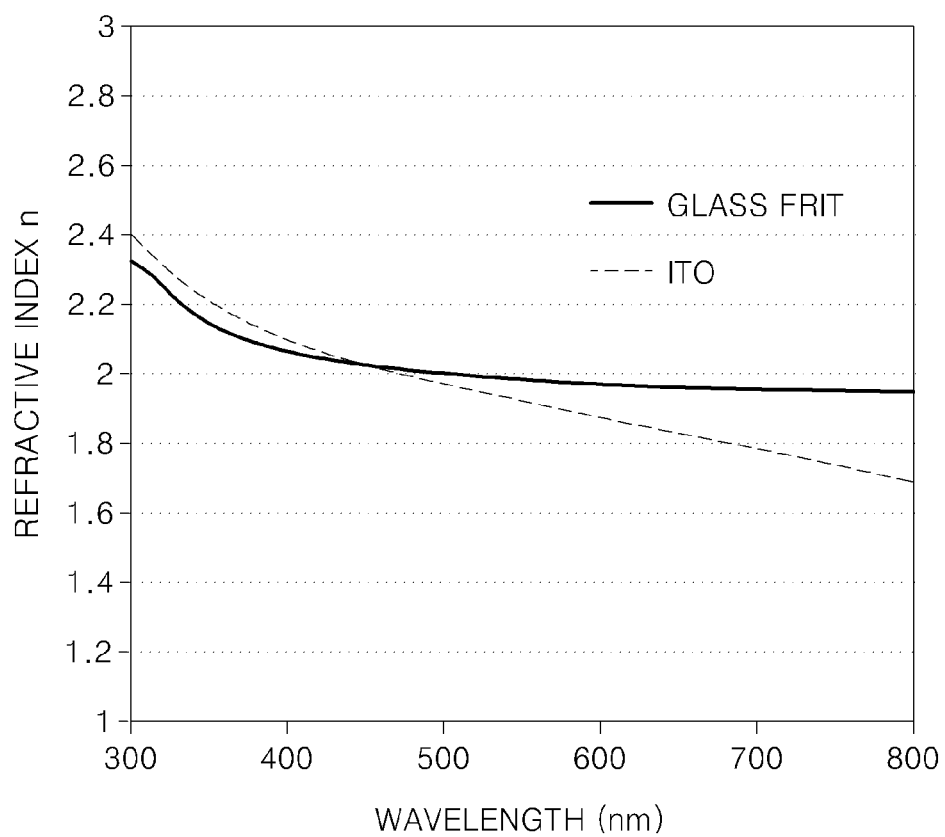
FIG. 14 is a graph showing comparison of a refractive index of a glass frit used in a highly refractive layer and a refractive index of an ITO used in a transparent electrode.

FIG. 14 is a graph showing comparison of a refractive index of a glass frit used to form the highly refractive layer and a refractive index of the ITO used in the transparent electrode. Referring to FIG. 14, when comparing the refractive index of the glass frit and that of ITO, the refractive index of the glass frit is greater than tha of the ITO. As can be seen from this, a refractive index of the substrate (the highly refractive layer) is greater than that of the transparent electrode so that a decrease in light extraction efficiency due to total internal reflection may be prevented.

(Examination of Sintering Conditions of Glass Paste Composite)

Next, optimum sintering conditions for a glass frit composite were examined. The above-described non-corrugated substrate was used as a support substrate, and the glass paste composite described above was used to manufacture a sample of a substrate for a light emitting device, which includes a highly refractive layer formed on a support substrate. Air sintering according to the current embodiment (hereinafter, also referred to as "Air") refers to an operation in which a glass paste composite is sintered under an air pressure. In addition, vacuum sintering (hereinafter also referred to as "Vac.") refers to an operation in which a furnace is decompressed to 0.3 Pa or less at a predetermined timing while a glass paste composite is being sintered. Also, pressure sintering (hereinafter also referred to as "Press") refers to an operation in which a furnace is pressurized to 110 kPa or greater at a predetermined timing while a glass paste composite is being sintered.

In this examination, a sintering operation was performed in two operations, Operation A (removing away a binder resin) and Operation B (sintering a glass frit) under process conditions as shown in Table 1. While temperature conditions for each operation are shown in Table 1, for air sintering (Air), both operations were performed in the air, and for vacuum sintering and pressure sintering, Operation A was performed in the air, and Operation B was performed under a vacuum condition and a pressurized condition. By sintering the glass paste composite as described above, transmittance and a Haze value of the highly refractive layer formed on the support substrate were measured. Results of measurement are shown in Table 2.

As can be seen from Table 2, after sintering the binder resin, the Haze value is rapidly deceased by adding a sintering operation performed in a vacuum or under a pressure. This is regarded to be due to the fact that bubbles existing in the highly refractive layer shrank (or are even reduced). In addition, it is found that as the Haze value is reduced, transmittance is increased by about 10%. Moreover, Ref. (Glass) of Table 2 denotes data about a glass substrate used as a support substrate shown for reference. In addition, when observing the inside of the sintered highly refractive layer by using an optical microscope (view of observation 0.05 mm$^2$), a ratio of bubbles in the sample of the air sintering was 6.2% to about 6.8%, and 0.1% to 0.3% in the sample of vacuum sintering. As can be seen from these results, the ratio of bubbles of vacuum sintering was reduced by about 2% to 5% compared to that of air sintering.

TABLE 1

Process conditions

|  | Operation A [° C.] | Operation B [° C.] |
|---|---|---|
| (1) Air | 400 | 500 |
| (2) Vac. | | |
| (3) Press | | |

TABLE 2

Transmittance, Haze value

|  | Transmittance [%] | Haze value [%] |
|---|---|---|
| Ref. (Glass) | 91.7 | 0.15 |
| (1) Air | 72.2 | 40.2 |
| (2) Vac. | 82.7 | 2.66 |
| (3) Press | 81.3 | 2.75 |

Next, examination of a diffusion effect by the corrugated surface formed on the surface of the support substrate will be described. The glass paste composite obtained in the above-described manner was coated on the corrugated substrate and the non-corrugated substrate by using a doctor blade. Then, the solvent was removed using a hot air dryer of about 120° C. Then, the corrugated substrate and the non-corrugated substrate were moved to a furnace and the binder was removed by sintering at a temperature of about 350° C. for about 20 minutes. Then, transparent highly refractive layers (glass layers) were respectively formed on surfaces of the corrugated substrate and the non-corrugated substrate by sintering the both substrates at a temperature of about 500° C. for 30 minutes.

Next, the thickness of the glass layer formed on the non-corrugate substrate was measured using a stylus type film thickness meter (e.g., DEKTAK, a product of VLVAC Co.) The thickness was about 25 µm. When the glass layer was observed with an optical microscope, a few bubbles exist in the film formed by the glass paste composite. However, the number and size of the bubbles were substantially small, no light diffusion thereby occurs. Accordingly, a glass layer having a non-color transparent and smooth was formed. The average surface roughness Ra of the non-corrugated substrate, on which the glass layer was formed, was about 30 nm or below about 30 nm.

The total light transmittance Tt of the non-corrugated substrate was about 79%, and haze value was about 10%. The refractive index nd of the glass layer was nd=about 1.99, which was measured using a prism coupler (e.g., Model 2000, a product of Metricon Co.).

However, the corrugated substrate, on which the glass layer was formed, had the total light transmittance Tt of about 71%, the haze value of about 90%, and the average surface roughness Ra of equal to or less than about 30 nm. Accordingly, a support substrate having a smooth surface may be manufactured even though the corrugated substrate includes a diffusing layer having a corrugated surface.

Next, an ITO film having a thickness of about 120 nm was formed on the corrugated substrate, the non-corrugated substrate, and the soda lime substrate using a direct current ("DC") magnetron sputtering apparatus. The corrugated substrate, on which the glass layer was formed, is referred to as substrate A, the non-corrugated substrate, on which the glass layer was formed, is referred to as substrate B, and the soda lime substrate is referred to as substrate C.

Figure 15:
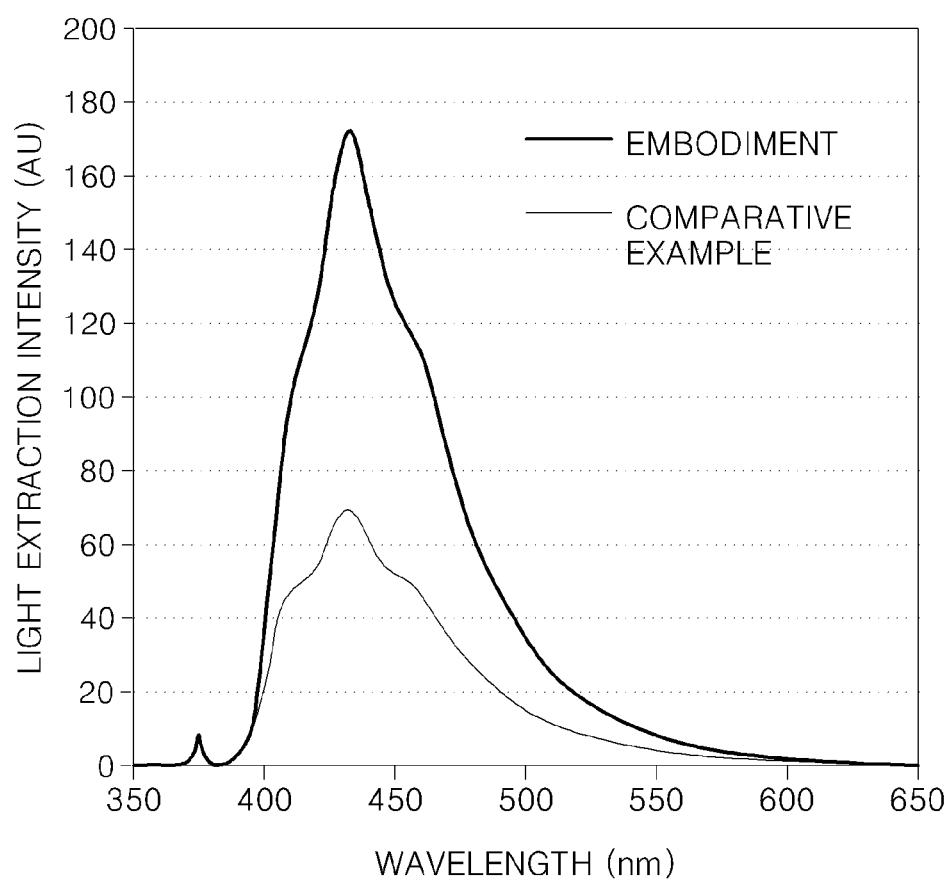
FIG. 15 is a graph showing light extraction intensity (in arbitrary unit: AU) versus wavelength (nanometer: nm) according to embodiments of the present invention and the comparative examples.

Next, a blue light fluorescent substance (e.g., LMMOGENF650, a product of BASF Co.) was deposited on the substrates A through C to a thickness of about 200 nm using a resistance heating deposition device. Fluorescence intensities of each of the substrates A through C on which fluorescence films are formed were measured using a fluorospectrometer (e.g., F7000 which is a product of Hitachi technology Co.) as shown in FIG. 9. When the quantity of emitted light collected in an integrating sphere from all emission directions is standardized (light extraction intensity) using an absorption quantity of excited light, the results shown in Table 3 were obtained. FIG. 15 is a graph showing light extraction intensity (in arbitrary units; AU) versus wavelength (nm) in accordance with the embodiments and the comparative examples.

TABLE 3

|  | Substrate | Content | light extraction intensity |
|---|---|---|---|
| Embodiment | (A) | Corrugated substrate/highly refractive Glass layer/ITO/blue color fluorescence film | 1.6 |
| Comparative Example | (B) | Non-corrugated substrate/highly refractive Glass layer/ITO/blue color fluorescence film | 0.9 |
| Comparative Example | (C) | Planarizing substrate (soda lime substrate)/ITO/blue color fluorescence film | 1.0 |

Although the examples shown in Table 3 and FIG. 15 do not show a light emitting device that was actually manufactured, as shown in Table 3 and FIG. 15, light extraction efficiency was significantly increased when the substrate according to the present invention was used.

Table 4 shows light extraction intensities of the embodiment and a comparative example when a green light fluorescent substance, a red light fluorescent substance, and a white light fluorescent substance are respectively used. The substrate used here is as shown in Table 4. As can be seen from Table 4, when the support substrate to which the present invention is applied was used, light extraction efficiency may be improved effectively for light of any wavelength.

TABLE 4

| | Substrate | Content | light extraction efficiency |
|---|---|---|---|
| Embodiment | (A) | corrugated substrate/highly refractive Glass layer/ITO/red color fluorescence film | 1.5 |
| Comparative Example | (C) | Planarizing substrate (soda lime substrate)/ITO/red color fluorescence film | 1.0 |
| Embodiment | (A) | corrugated substrate/highly refractive Glass layer/ITO/green color fluorescence film | 1.7 |
| Comparative Example | (C) | Planarizing substrate (soda lime substrate)/ITO/green color fluorescence film | 1.0 |
| Embodiment | (A) | corrugated substrate/highly refractive Glass layer/ITO/white color fluorescence film | 1.6 |
| Comparative Example | (C) | Planarizing substrate (soda lime substrate)/ITO/white color fluorescence film | 1.0 |

(Relationship Between the Roughness Ra and Haze Value and Extraction Efficiency)

Next, Table 5 shows light extraction intensities of the embodiment prepared with various average surface roughnesses Ra of the corrugated substrate and a comparative example. Also, Table 5 shows light extraction intensities of the embodiments having different average surface roughness Ra, haze values, and methods of manufacturing ridges. As shown in Table 5, when the size of ridges is small, for example, the average surface roughness Ra is about 0.01 μm or about 0.1 μm, the haze value is thereby small such that the light extraction efficiency is substantially small. When a corrugated substrate had an average surface roughness Ra of greater than about 0.7 μm, the haze value is substantially high and the light extraction efficiency is thereby substantially improved.

TABLE 5

| | average surface roughness Ra of corrugated substrate (μm) | Haze (%) | Method of manufacturing ridges | light extraction intensity |
|---|---|---|---|---|
| Embodiment | 0.01 | 8 | Wet etching | 1.05 |
| Embodiment | 0.1 | 35 | Sand blast | 1.1 |
| Embodiment | 0.7 | 88 | Sand blast | 1.6 |
| Embodiment | 1 | 90 | Wet etching | 1.7 |
| Embodiment | 2 | 91 | Sand blast | 1.8 |
| Embodiment | 5 | 90 | Wet etching | 1.7 |
| Comparative Example | 0.005 | 0.2 | No-treatment | 1.0 |

(Examination of Desired Layer Thickness)

Table 6 shows film thickness of the glass layer that has a high refractive index on the corrugated substrate. When the highly refractive index glass layers having various thickness are formed on the corrugated substrate having various average surface roughness Ra, the thickness of the glass layer may be predetermined based on the average surface roughness Ra to obtain a support substrate having a substantially smooth surface. As shown in Table 4, when the average surface roughness Ra is about 0.7 μm, the glass layer may have a thickness equal to or greater than about 20 μm to obtain a substantially planarized surface. In an embodiment, the glass layer may have a film thickness about 30 times to about 40 times greater than the average surface roughness Ra to obtain a substantially planarized surface. In an embodiment, a maximum surface roughness Rz (maximum size) may be about 10 times to about 20 times greater than the average surface roughness Ra.

TABLE 6

| | Average surface roughness Ra of corrugated substrate (μm) | Maximum surface roughness Rz of corrugated substrate (μm) | Film thickness of planarizing layer (μm) | Average surface roughness Ra of support substrate, after planarization (μm) |
|---|---|---|---|---|
| Embodiment | 0.1 | 1.7 | 1 | 0.5 |
| Embodiment | 0.1 | 1.7 | 4 | less than 0.03 |
| Embodiment | 0.7 | 12 | 0.1 | 0.7 |
| Embodiment | 0.7 | 12 | 1 | 0.5 |
| Embodiment | 0.7 | 12 | 12 | 0.1 |
| Embodiment | 0.7 | 12 | 25 | less than 0.03 |
| Embodiment | 2 | 23 | 10 | 0.5 |
| Embodiment | 2 | 23 | 55 | less than 0.03 |

(Example of Corrugated Surface Having a Lens Structure)

A half-sphere micro-lens array having a diameter of about 30 μm was formed on a soda lime glass substrate using a mold thermal transfer method. Next, a substrate having a highly refractive layer with a micro-lens structure therein was prepared by coating and drying the glass paste composite described above such that the film thickness of the glass paste composite became about 25 μm. Then, an ITO film having a thickness of about 120 nm was formed on the substrate (substrate A) using a DC magnetron sputtering apparatus. To prepare comparative examples, after forming a glass paste composite film having a thickness of about 25 μm on a soda lime glass substrate, an ITO film having a thickness of about 120 nm was formed on the glass paste composite film by using a sputtering apparatus (substrate B), and an ITO film having a thickness of about 120 nm was formed on a soda lime glass by using a sputtering apparatus (substrate C). A blue light fluorescent substance (e.g., LMMOGENF650, which is a product of BASF Co.) was deposited on the substrates A through C to a thickness of about 200 nm by using a resistance heating deposition device. Fluorescence intensities of the substrates A through C on which fluorescence films were formed were measured using a fluorospectrometer (e.g., F7000, which is a product of Hitachi technology Co.). Table 7 shows light extraction intensity of the embodiment and the comparative examples based on the quantity of emitted light collected in an integrating sphere from all emission directions was standardized (light extraction intensity) via an absorbed quantity of excited light. As shown in Table 7, when a substrate included a uniform corrugated surface having a unit structure of a micro lens, the light extraction efficiency is substantially increased.

TABLE 7

| | Substrate | Content | light extraction intensity |
|---|---|---|---|
| Embodiment | (A) | Micro lens included substrate/glass layer/ITO/blue color fluorescence film | 1.8 |

TABLE 7-continued

| Substrate | | Content | light extraction intensity |
|---|---|---|---|
| Comparative Example | (B) | Planarizing substrate/glass layer/ ITO/blue color fluorescence film | 0.9 |
| Comparative Example | (C) | Planarizing substrate/ITO/blue color fluorescence film | 1.0 |

Examples of OLED

First Embodiment

To evaluate an OLED having the structure according to the first embodiment of the present invention, substrate samples T1-1 through T1-6 were manufactured as will be described below. Substrate T1-1 is a sample substrate manufactured for comparison and is a glass substrate on which indium tin oxide (ITO) was formed directly as a transparent electrode. Substrate T1-2 was formed by coating a non-corrugated glass substrate with a glass paste composite (nd=1.98, composition: to be described later) having a refractive index that is similar to that of a transparent electrode (ITO) by using a bar coating method, and then sintering the resultant in the air (Air) to form a highly refractive layer thereon. Substrate T1-3 was formed by coating a non-corrugated glass substrate with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitol acetate) having a refractive index that is similar to that of a transparent electrode (ITO) by using a bar coating method, and then sintering the resultant in a vacuum (Vac.) to form a highly refractive layer thereon. Substrate T1-4 was formed by coating a glass substrate, on which a non-uniform corrugate structure is formed by sand blasting, with a glass paste composite by using a bar coating method, and then sintering the resultant in the air (Air) to form a highly refractive layer thereon. Substrate T1-5 was formed by coating a glass substrate, on which a non-uniform corrugate structure is formed by sand blasting, with a glass paste composite by using a bar coating method, and then sintering the resultant in a vacuum (Vac.) to form a highly refractive layer thereon. Substrate T1-6 was formed by being sintered in a vacuum in the same manner as T1-5 and then by having an outermost surface be polished by a lapping process to further increase planarization of the substrate. The lapping process is effective on a substrate that is sintered in a vacuum. If there are bubbles in the highly refractive layer, defects such as valleys due to the bubbles existing in the surface are detected by lapping the surface of the highly refractive layer. Accordingly, in order to further planarize the surface of the substrate by lapping, bubbles in the highly refractive layer need to be removed by sintering the same in a vacuum.

In addition, according to the method disclosed in the patent reference 4, a diffusion component such as bubbles or fillers are intentionally formed in a highly refractive glass so that the highly refractive layer itself is used to function as a diffusion layer; however, if there are bubbles or fillers in a portion contacting a transparent electrode, it is difficult to form a uniform transparent electrode, and accordingly, it is difficult to provide a long lifespan or reliability.

Substrates T1-1 through T1-6 were coated with a glass paste composite and then leveled for 60 minutes in a room in which absorption was controlled to 50%, and then dried by hot air at 120° C. for 30 minutes. Also, after forming ITO on each substrate, the substrates were cleansed by using a brush cleaning operation, an ultrasonic cleaning operation, a degreasing operation, or the like, and then were subject to $UV/O_3$ cleaning. Further, PEDOT/PSS was formed as a hole injection layer; an interlayer (IL) layer was formed as a hole transport layer; and a polyfluorene based material was formed as an emissive layer (EML) by spin coating. Then, a cathode electrode was formed of aluminum (Al) by vacuum deposition to have a thickness of 70 nm. Finally, a sealing substrate on which a calcium oxide desiccant is attached was attached to an OLED substrate by using a UV hardening resin, and then a UV ray was irradiated thereto to harden the resin to manufacture OLED samples. Current-voltage-total luminous flux characteristic of the prepared OLED samples were measured using a measurement apparatus prepared by combining a SourceMeter® 2400 which is a product of Keithley Instrument Inc., an integrating sphere, and an illuminometer. The current-voltage-total luminous flux characteristics of all of the prepared OLED samples are substantially the same as each other. As can be seen from results of measuring luminous flux-current density, when the substrates for the light emitting device according to the first embodiment of the present invention (Substrates T1-5 and T1-6) are used, a luminous flux of about 1.8 times to about 2.0 times may be obtained compared to when other substrates are used. Table 8 shows extraction efficiency of OLED samples manufactured by using Substrates T1-1 through T1-6 and yields thereof. In addition, extraction efficiency was shown in a relative evaluation in which an extraction efficiency of Substrate T1-1, on which a highly refractive layer was not formed, was set as 1.

TABLE 8

| | Extraction efficiency | Yield |
|---|---|---|
| Substrate T1-1 | 1 | 100% |
| Substrate T1-2 | 1 | 40% |
| Substrate T1-3 | 1 | 60% |
| Substrate T1-4 | 1.91 | 40% |
| Substrate T1-5 | 1.85 | 60% |
| Substrate T1-6 | 1.80 | 70% |

As shown in Table 8, the yield was increased when vacuum sintering was performed compared to when air sintering was performed. Also, if polishing was performed after the sintering, the yield was rapidly increased. However, no improvement in light extraction was to be seen from the sample which corresponds to the device disclosed in the patent reference 4 (Substrate T1-2). The reasons that a light extraction effect was not obtained are considered to be due to the bubble size and the number of bubbles and because it was difficult to control positions of the bubbles and thus difficult to diffuse light to extract light through the front surface of the substrate.

Examples of Organic Thin Film Device (OLED)

Second Embodiment

To evaluate OLED having the structure according to the second embodiment of the present invention, Substrates T2-1 through T2-3 were manufactured. Substrate T2-1 is manufactured for comparison and is a glass substrate on which ITO was directly formed as a transparent electrode. Substrate T2-2 was formed by coating a glass substrate, on which a non-uniform corrugate structure is formed by sand blasting, with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitol acetate) having a refractive index that is similar to that of a transparent electrode (ITO) by using a bar coating method, and then sintering the resultant first in the air (Air), and then the glass paste composite was coated again thereon and then the substrate was sintered in a vacuum (Vac.) to form a highly refractive layer having a two-layer structure thereon. Substrate T2-3 was formed by coating a glass substrate, on which a non-uniform corrugate structure is formed by sand blasting, with the glass paste composite by using a bar coating method, and then sintering the same first in a vacuum (Vac.), and then the glass paste composite was coated again thereon and then the substrate was sintered in a vacuum (Vac.) to form a highly refractive layer having a two-layer structure thereon.

Substrates T2-1 through T2-3 were coated with a glass paste composite and then leveled for 60 minutes in a room in which absorption was controlled to 50%, and then dried by hot air at 120° C. for 30 minutes. Also, after forming ITO on each substrate, the substrates were cleansed by using a brush cleaning operation, an ultrasonic cleaning operation, a degreasing operation, or the like, and then were subject to $UV/O_3$ cleaning. Further, PEDOT/PSS was formed as a hole injection layer, an interlayer (IL) layer was formed as a hole transport layer, and a polyfluorene based material was formed as an emissive layer (EML) by spin coating. Then, a cathode electrode was formed of aluminum (Al) by vacuum deposition to have a thickness of 70 nm. Finally, a sealing substrate on which a calcium oxide desiccant is attached was attached to an OLED substrate by using a UV hardening resin and then a UV ray was irradiated thereto to harden the resin to manufacture OLED samples. Current-voltage-total luminous flux characteristic of the prepared organic light emitting devices were measured using a measurement apparatus prepared by combining a SourceMeter® 2400 which is a product of Keithley Instrument Inc., an integrating sphere, and an illuminometer. The current-voltage-total luminous flux characteristics of all of the prepared OLED samples are substantially the same as each other. As can be seen from results of measuring luminous flux-current density, when the substrates for the light emitting device according to the second embodiment of the present invention (Substrates T2-1 and T2-3) are used, a luminous flux of about 1.9 times to about 2.0 times may be obtained compared to when other substrates are used. Table 9 shows extraction efficiency of the OLED samples manufactured by using Substrates T2-1 through T2-3 and yields thereof. In addition, extraction efficiency was shown in a relative evaluation in which an extraction efficiency of Substrate T2-1, on which a highly refractive layer was not formed, was set as 1.

TABLE 9

|  | Extraction efficiency | Yield |
| --- | --- | --- |
| Substrate T2-1 | 1 | 100% |
| Substrate T2-2 | 2.0 | 60% |
| Substrate T2-3 | 1.9 | 80% |

As shown in Table 9, the yields were increased in any case where either Substrate T2-2 or Tab 2-3 was used.

Examples of Organic Thin Film Device (OLED)

Third Embodiment

To evaluate OLED having the structure according to the third embodiment of the present invention, Substrates T3-1 through T3-4 were manufactured. Substrate T3-1 is manufactured for comparison and is a glass substrate on which ITO was directly formed as a transparent electrode. Substrate T3-2 was formed by coating a glass substrate, on which a non-uniform corrugate structure is formed by sand blasting, with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of the transparent electrode (ITO) by using a bar coating method, and then sintering the resultant in the air (Air) to form a single-layer highly refractive layer thereon. Substrate T3-3 was formed by coating a glass substrate, on which a non-uniform corrugate structure is formed by sand blasting, with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of the transparent electrode (ITO) by using a bar coating method, and then sintered first in the air (Air) and then the glass paste composite (nd=1.98, composition: prepared by mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) was coated again thereon and then the substrate was sintered in a vacuum (Vac.) to form a highly refractive layer having a two-layer structure thereon. Substrate T3-4 was formed by coating a glass substrate, to which a non-uniform corrugate structure is formed by sand blasting, with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of the transparent electrode (ITO) and a diffusion material (combination of $TiO_2$, $SiO_2$, and $Al_2O_3$) by using a bar coating method and sintering the resultant first in a vacuum (Vac.), and then the glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of a transparent electrode (ITO) was coated again thereon and then the substrate was sintered in a vacuum (Vac.) to form a highly refractive layer having a two-layer structure thereon.

Substrates T3-1 through T3-4 were coated with a glass paste composite and then leveled for 60 minutes in a room in which absorption was controlled to 50%, and then dried by hot air at 120° C. for 30 minutes. Also, after forming ITO on each substrate, the substrate was cleansed by using a brush cleaning operation, an ultrasonic cleaning operation, a degreasing operation, or the like, and then was subject to $UV/O_3$ cleaning. Further, PEDOT/PSS was formed as a hole injection layer, an interlayer (IL) layer was formed as a hole transport layer, and a polyfluorene based material was formed as an emissive layer (EML) by spin coating. Then, a cathode electrode was formed of aluminum (Al) by vacuum deposition to have a thickness of 70 nm. Finally, a sealing substrate on which a calcium oxide desiccant is attached was attached to an OLED substrate by using a UV hardening resin and then a UV ray was irradiated thereto to harden the resin to manufacture OLED samples. Current-voltage-total luminous flux characteristic of the prepared organic light emitting devices were measured using a measurement apparatus prepared by combining a SourceMeter® 2400 which is a product of Keithley Instrument Inc., an integrating sphere, and an illuminometer. The current-voltage characteristics of all of the prepared OLED samples are substantially the same as each other. As can be seen from results of measuring luminous flux-current density, when the substrates for the light emitting device according to the third embodiment of the present invention (Substrates T3-3 and T3-4) are used, a luminous flux of about 1.9 times to about 2.0 times may be obtained compared to when other substrates are used. Table 10 shows extraction efficiency of the OLED samples manufactured by using Substrates T3-1 through T3-4 and yields thereof. In addition, extraction efficiency was shown in a relative evaluation in which an extraction efficiency of Substrate T3-1 on which no highly refractive layer was formed was set as 1.

TABLE 10

|  | Extraction efficiency | Yield |
|---|---|---|
| Substrate T3-1 | 1 | 100% |
| Substrate T3-2 | 1.9 | 40% |
| Substrate T3-3 | 2.0 | 60% |
| Substrate T3-4 | 1.9 | 80% |

As shown in Table 10, the yields were increased in any case where either Substrate T3-3 or T3-4 was used. However, when Substrate T3-2 was used, the interface between the highly refractive layer and the transparent electrode (ITO) was not planarized, and instead, defects were created in the transparent electrode (ITO). As a result, a leakage current was detected. The leakage current partially deteriorated the OLEDs or significantly reduced the reliability of the OLEDs.

Examples of Organic Thin Film Device (OLED)

Fourth Embodiment

To evaluate an OLED having the structure according to the fourth embodiment of the present invention, substrates T4-1 through T4-4 were manufactured. Substrate T4-1 was manufactured for comparison and is a glass substrate on which ITO was formed directly as a transparent electrode. Substrate T4-2 was formed by coating a non-corrugated glass substrate with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of a transparent electrode (ITO) by using a bar coating method, and then sintering the resultant in the air (Air) to form a single-layered highly refractive layer thereon. Substrate T4-3 was formed by coating a non-corrugated glass substrate with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of a transparent electrode (ITO) and a diffusion material (combination of $TiO_2$, $SiO_2$, and $Al_2O_3$) by using a bar coating method, and then sintering the resultant first in the air (Air), and then coating the glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) again thereon and then sintering the resultant in a vacuum (Vac.) to form a highly refractive layer having a two-layer structure thereon. Substrate T4-4 was formed by coating a glass substrate, to which a non-corrugated structure is formed by using a sand blast method, with a glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of a transparent electrode (ITO) and a diffusion material (combination of $TiO_2$, $SiO_2$, and $Al_2O_3$) by using a bar coating method, and then sintering the resultant first in a vacuum (Vac.), and then coating the glass paste composite (nd=1.98, composition: prepared by dissolving and mixing $Bi_2O_3$—$B_2O_3$—$SiO_2$—ZnO based glass frit (Tg=400° C.), ethylcellulose STD45 (available by Dow Chemicals), terpineol, and butylcarbitolacetate) having a refractive index that is similar to that of a transparent electrode (ITO) again thereon, and then sintering the resultant in a vacuum (Vac.) to form a highly refractive layer having a two-layer structure thereon.

Substrates T4-1 through T4-4 were coated with a glass paste composite and then leveled for 60 minutes in a space in which absorption was controlled to 50%, and then dried using a hot air at 120° C. for 30 minutes. Also, after forming ITO on each substrate, the substrate was cleansed by using a brush cleaning operation, an ultrasonic cleaning operation, degreasing operation, or the like, and then was subject to UV/$O_3$ cleaning. Further, PEDOT/PSS was formed as a hole injection layer, interlayer (IL) layer was formed as a hole transport layer, and a polyfluorene based material was formed as an emissive layer (EML) by using spin coating. Then, a cathode electrode was formed of aluminum (Al) by vacuum deposition to have a thickness of 70 nm. Finally, a sealing substrate on which a calcium oxide desiccant is attached was attached to an OLED substrate by using a UV hardening resin and then a UV ray was irradiated thereto to harden the resin to manufacture OLED samples. Current-voltage-total luminous flux characteristic of the prepared organic light emitting devices were measured using a measurement apparatus prepared by combining a SourceMeter® 2400 which is a product of Keithley Instrument Inc., an integrating sphere, and an illuminometer. The current-voltage characteristics of all of the prepared OLED samples are substantially the same as each other. As can be seen from results of measuring luminous flux-current density, when the substrates for the light emitting device according to the fourth embodiment of the present invention (Substrates T4-3 and T4-4) are used, a luminous flux of about 1.9 times to about 2.0 times may be obtained compared to when other substrates are used. Table 11 shows extraction efficiency of the OLED samples manufactured by using Substrates T4-1 through T4-4 and yields thereof. In addition, extraction efficiency was shown in a relative evaluation in which an extraction efficiency of Substrate T4-1, on which a highly refractive layer was not formed, was set as 1.

TABLE 11

|  | Extraction efficiency | Yield |
|---|---|---|
| Substrate T4-1 | 1 | 100% |
| Substrate T4-2 | 2.0 | 40% |
| Substrate T4-3 | 2.0 | 60% |
| Substrate T4-4 | 1.9 | 80% |

As shown in Table 11, the yields were increased in any case where either Substrate T4-3 or T4-4 was used. However, when Substrate T4-2 was used, the interface between the highly refractive layer and the transparent electrode (ITO) was not planarized but defects were created in the transparent electrode (ITO). Accordingly, a leakage current was detected.

The leakage current partially deteriorated the OLEDs or significantly reduced the reliability of the OLEDs.

Example of Illumination Apparatus

Example of White Light Illumination

Three types of layers were prepared as below. First, a corrugated glass substrate was coated with a glass paste composite (nd=1.98, composition: prepared by dissolving and mixing $Bi_2O_3$—$B_2O_3$—$SiO_2$—ZnO based glass frit (Tg=400° C.), ethyl cellulose STD45 (available by Dow Chemicals), terpineol, and butylcarbitolacetate) having a refractive index that is similar to that of a transparent electrode (ITO) by using a bar coating method, and then sintered in a vacuum to form a substrate A on which a highly refractive layer is formed. Secondly, a non-corrugated glass substrate was coated with the glass paste composite using a bar coating method and then sintered in a vacuum to form a substrate B, on which a highly refractive index layer is formed. Finally, a non-corrugated glass substrate C was prepared. Next, an ITO was formed on the three types of the substrates A through C and then the substrates A through C were subject to a cleaning operation such as brush cleaning, ultrasonic cleaning, or degreasing and then to $UV/O_3$. Further, PEDOT/PSS was formed as a hole injection layer, an interlayer (IL) layer was formed as a hole transport layer, and a polyfluorene based material was formed as an emissive layer (EML) by spin coating. As the emissive layer, a layer formed by mixing red, green, and blue light emitting materials in a ratio of 1:1:8 was used. Then, aluminum (Al) was formed by vacuum deposition to have a thickness of 70 nm as a cathode electrode. Lastly, a sealing substrate on which a calcium oxide desiccant is attached was attached to an OLED substrate by using a UV hardening resin and then a UV ray was irradiated thereto to harden the resin to manufacture samples according to Embodiment A, Comparative example B, and Comparative example C.

Figure 16:
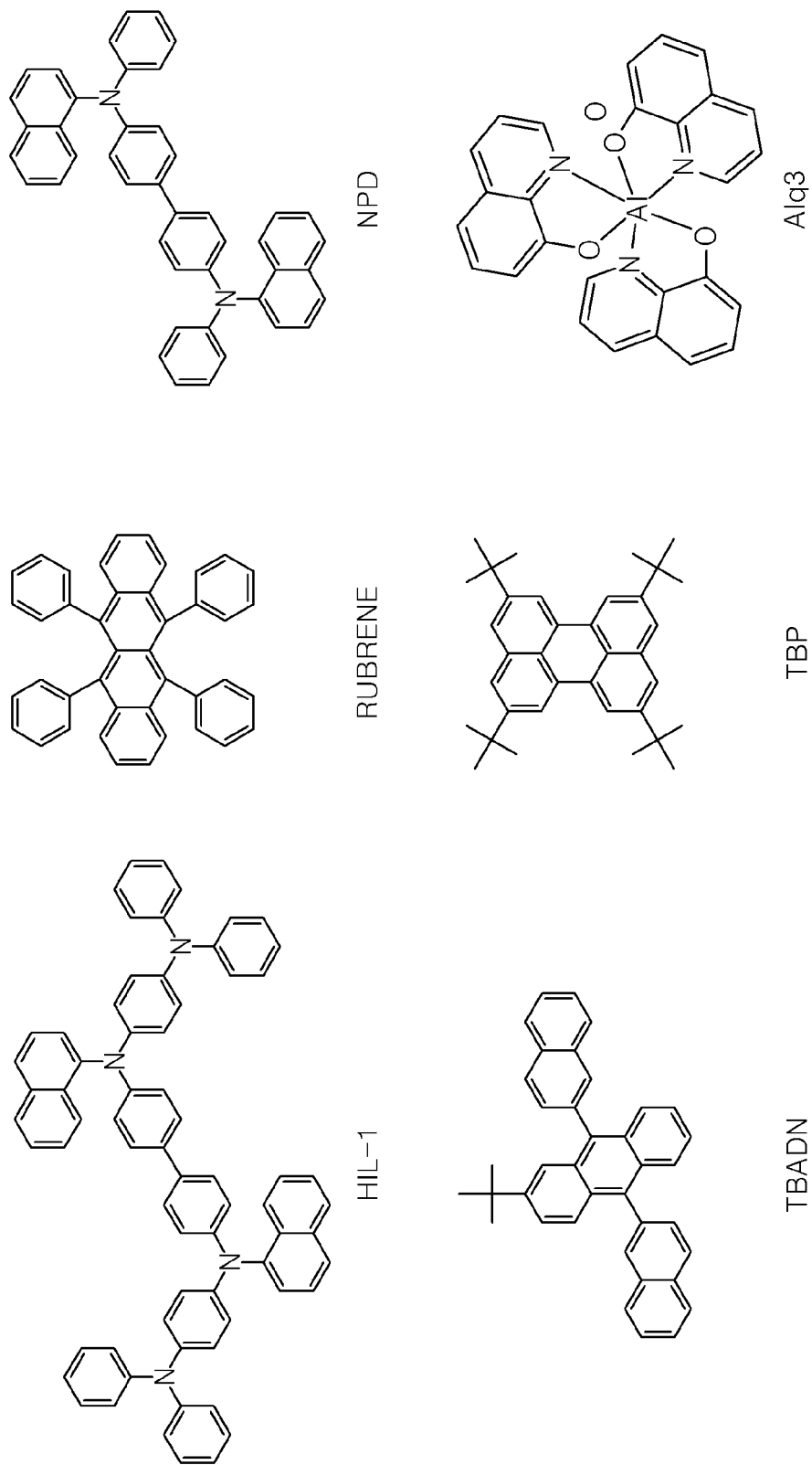
FIG. 16 is a molecular structure diagram of compounds used in embodiments of the invention.

Hereinafter, organic light emitting devices (device area may be about 0.04 $cm^2$) including the embodiment and the comparative examples will be described. To prepare the organic light emitting devices, the substrates A through C including ITO as in Table 4 were washed with isopropyl alcohol ("IPA") and pure water, and then, was treated with an ultraviolet ("UV") ozone cleaner. N,N'-bis(naphthalen-1-yl)-N,N'-bis(4-(N,N-diphenylamino)phenyl)benzidine ("HIL-1") (refer to FIG. 16) as a hole injection layer, N,N'-di-1-naphthyl-N,N'-diphenyl-1,1'-biphenyl-4,4'diamine ("NDP") (refer to FIG. 11) as a hole transport layer, and Alq3 (refer to FIG. 16) as a green light emitting layer were deposited to thicknesses of about 60 nm, about 20 nm, and about 60 nm, respectively, using a vacuum evaporation method. Also, an organic light emitting device was formed by depositing LiF as an electron injection layer and Al as a cathode electrode to thicknesses of about 3 nm and about 200 nm, respectively. The organic light emitting devices prepared as described above were moved into a globe box maintained under a dry nitrogen atmosphere without being exposed to the atmosphere, and the organic light emitting devices were attached to sealing substrates to which an absorbing agent that includes a barium oxide powder is provided using a ultraviolet hardening resin sealant, and then, the organic light emitting devices were sealed by hardening the sealant by irradiating ultraviolet rays.

Figure 17:
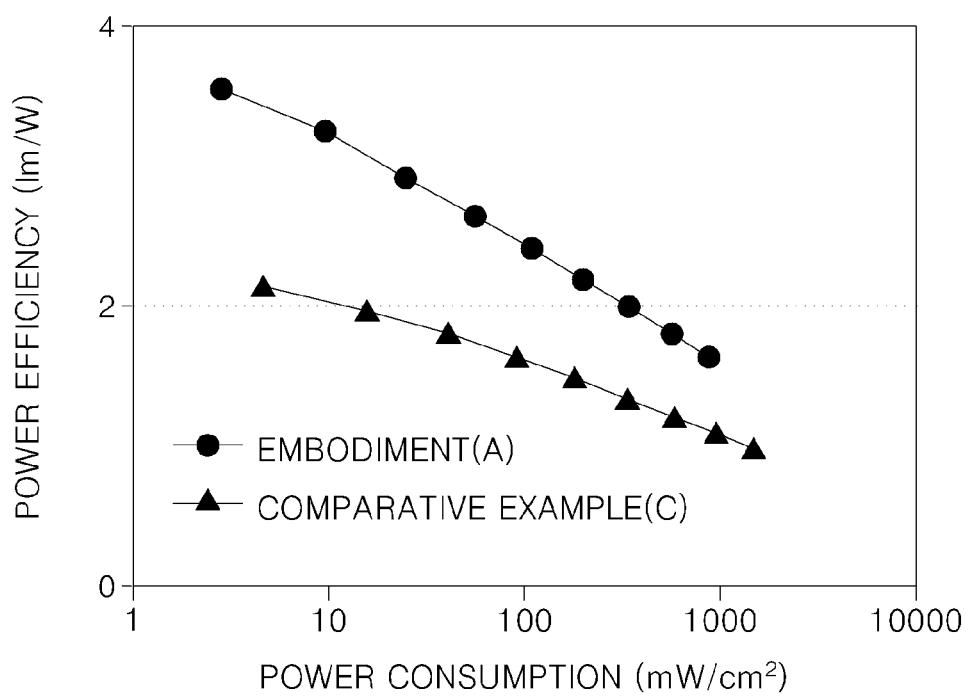
FIG. 17 is a graph showing power efficiency (lumen per watt: lm/W) versus power consumption (milliwatt per square centimeter: $mW/cm^2$) according to an embodiment of the invention and a comparative example.

Current-voltage-total luminous flux characteristic of the prepared organic light emitting devices were measured using a measurement apparatus prepared by combining a SourceMeter® 2400 which is a product of Keithley Instrument Inc., an integrating sphere, and an illuminometer. The current-voltage-total luminous flux characteristics of all of the prepared organic light emitting devices are substantially the same as each other. When power consumption of an organic light emitting device that uses the support substrate (e.g., the embodiment) is compared with the power consumption of an organic light emitting device that does not use the support substrate (e.g., the comparative examples), as shown in Table 12 and in FIG. 17 the organic light emitting device that uses the support substrate has an light extraction efficiency of about 1.5 times greater than the organic light emitting device that does not use the support substrate (comparative example).

TABLE 12

|  | Substrate | Content | Power efficiency lm/W@ 100 mW/$cm^2$ |
|---|---|---|---|
| Embodiment | (A) | corrugated substrate/glass layer/ITO/OLED | 2.45 |
| Comparative Example | (B) | Planarizing substrate/glass layer/ITO/OLED | 1.46 |
| Comparative Example | (C) | Planarizing substrate/ITO/OLED | 1.62 |

White color organic light emitting devices, each having an area of about 0.04 $cm^2$, were manufactured in the following method using the substrates A through C on which the ITO was attached as shown in Table 4.

First, after washing the substrates A through C using IPA and pure water, NPD was deposited to about 30 nm; as an orange light emitting layer, NPD which was doped with about 3% of Rubrene (refer to FIG. 16) by a co-deposition was deposited to about 60 nm; as a blue light emitting layer, 2-methyl-9,10-bis(naphthalen-2-yl)anthracene ("TBADN") (refer to FIG. 16) which was doped with about 1% of tribromophenol ("TBP") (refer to FIG. 16) was deposited to about 50 nm; Alq3 was deposited to about 20 nm; FLi was deposited to about 3 nm; and Al was deposited to about 200 nm. All depositions were performed by a vacuum evaporation method. The organic light emitting devices manufactured as described above were moved into a globe box which was maintained under a dry nitrogen atmosphere without being exposed to the atmosphere, the organic light emitting devices were attached to sealing substrates to which an absorbing agent that includes a barium oxide powder using a ultraviolet hardening resin sealant, and then, the organic light emitting devices were sealed by hardening the sealant by irradiating ultraviolet rays.

Current-voltage-total luminous flux characteristic of the samples were measured using a measurement apparatus prepared by combining a SourceMeter® 2400, which is a product of Keithley Instrument Inc., an integrating sphere, and an illuminometer. White light having a CIE color coordinates (0.31, 0.33) was obtained from all of the samples. The results are shown in Table 13.

TABLE 13

|  | Substrate | Content | Total luminous flux lm × $10^{-2}$@ 100 mA/$cm^2$ |
|---|---|---|---|
| Embodiment | (A) | corrugated substrate/glass layer/ITO/OLED | 10.65 |

TABLE 13-continued

| | Substrate | Content | Total luminous flux lm × 10⁻² @ 100 mA/cm² |
|---|---|---|---|
| Comparative example | (B) | Planarizing substrate/glass layer/ITO/OLED | 6.38 |
| Comparative example | (C) | Planarizing substrate/ITO/OLED | 6.72 |

As shown in Table 13, total luminous flux of Embodiment A was far greater than that of Comparative Example B or Comparative Example C. Also, light emission was observed in an area greater than the actual area of the device at a 2 mm angle, and thus the effect of light diffusion was detected. Also, a guided wave was confined from a cross-section of substrates in the devices of Comparative examples B and C, and thus it can be seen that light cannot be extracted through the front surface. However, in the device according to Embodiment A, a guided wave was not confined, and thus it is clear that light extraction efficiency has improved significantly.

According to the embodiments of the present invention, a glass paste composite including a low-melting point glass frit having a refractive index equal to or greater than that of a support substrate is used as a planarization material for planarizing an interface between a highly refractive layer formed on a surface of the support substrate and a transparent electrode, and the glass paste composite is sintered in a vacuum or under a pressure to solve problems in terms of mass production or manufacturing simplicity. Accordingly, light extraction efficiency of a light surface emitting device using an OLED may be improved and a yield of the OLED may be increased to thereby provide a substrate for a light emitting device having a long lifespan and high reliability, a method of manufacturing the substrate, and surface light emitting devices using the substrate. In addition, by using the substrate for the light emitting device, an illumination apparatus or a backlight having a long lifespan, a high reliability, and high performance may be provided.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A substrate for a surface light emitting device in which a transparent electrode, an organic thin film layer, and a cathode electrode are sequentially stacked, the substrate comprising:
    a transparent support substrate; and
    a highly refractive layer that is disposed between the support substrate and the transparent electrode and comprises at least one layer having a refractive index that is equal to or greater than a refractive index of the support substrate,
    wherein the highly refractive layer comprises a light diffusion unit that diffuses light incident from the transparent electrode and a planarized surface that contacts the transparent electrode,
    wherein a Haze value of the transparent support substrate is equal to or greater than 50%, and
    a Haze value of a layer of the highly refractive layer that is adjacent to the transparent electrode is equal to or less than 5%,
    wherein a diameter of bubbles in the highly refractive layer is 1/10th of a thickness of a layer of the highly refractive layer that is adjacent to the transparent electrode, and
    a ratio of the bubbles in the layer adjacent to the transparent electrode is a ratio of a surface area of a horizontal cross-section of the bubbles with resect to a total horizontal cross-sectional area of the layer adjacent to the transparent electrode and is 0.5% or less or a ratio of a surface area of a vertical cross-section of the bubbles with respect to a total vertical cross-sectional area of the layer adjacent to the transparent electrode and is 0.5% or less.

2. The substrate of claim 1, wherein an interface between the support substrate and the highly refractive layer is a corrugated surface.

3. The substrate of claim 2, wherein a layer thickness of the highly refractive layer is 30 times or greater and 40 times or less than an average surface roughness of the corrugated surface.

4. The substrate of claim 2, wherein a layer thickness of the highly refractive layer is 1.3 times or greater and 20 times or less than an average surface roughness of the corrugated surface.

5. The substrate of claim 2, wherein the highly refractive layer has a thickness in a range from about 3 μm to about 100 μm.

6. The substrate of claim 2, wherein the corrugated surface has an average surface roughness in a range from about 0.7 μm to about 5 μm.

7. The substrate of claim 2, wherein the corrugated surface has a non-uniform corrugated shape structure.

8. The substrate of claim 2, wherein the corrugated surface has a uniform corrugated shape structure.

9. The substrate of claim 8, wherein the corrugated surface has at least one of a pyramid-shaped ridge and a lens-shaped ridge.

10. The substrate of claim 1, wherein the highly refractive layer is a single layer.

11. The substrate of claim 1, wherein the highly refractive layer comprises:
    a light diffusion layer that is adjacent to the support substrate and includes the light diffusion unit; and
    a planarization layer that is adjacent to the transparent electrode and has the planarized surface.

12. The substrate of 11, wherein the light diffusion layer comprises a glass material and a diffusion material that has a refractive index different from a refractive index of the glass material.

13. The substrate of claim 12, wherein an interface between the support substrate and the highly refractive layer is a non-corrugated surface.

14. The substrate of claim 1, wherein the highly refractive layer comprises a glass paste composite comprising a glass frit, a solvent, and a resin.

15. The substrate of claim 14, wherein the glass frit has a glass transition temperature in a range from about 350° C. to about 450° C.

16. The substrate of claim 1, wherein a refractive index of the highly refractive layer and a refractive index of the transparent electrode satisfy the following inequality: $nd1/nd2 \geq 0.9$,
    wherein $nd1$ denotes the refractive index of the highly refractive layer, and $nd2$ denotes the refractive index of the transparent electrode.

17. A surface light emitting device comprising:
the substrate for surface light emitting device of claim 1; and
a transparent electrode stacked on the substrate;
an organic thin film layer disposed on the transparent electrode; and
a cathode electrode stacked on the organic thin film layer.

18. An illumination apparatus comprising the surface light emitting device according to claim 17.

19. A backlight comprising the surface light emitting device of claim 17.

* * * * *